(12) United States Patent
Kawamura et al.

(10) Patent No.: US 8,017,875 B2
(45) Date of Patent: Sep. 13, 2011

(54) PRINTED WIRING BOARD

(75) Inventors: Yoichiro Kawamura, Gifu (JP); Shigeki Sawa, Gifu (JP); Katsuhiko Tanno, Gifu (JP); Hironori Tanaka, Gifu (JP); Naoaki Fujii, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 11/476,559

(22) Filed: Jun. 29, 2006

(65) Prior Publication Data

US 2007/0086147 A1  Apr. 19, 2007

(30) Foreign Application Priority Data

Jun. 30, 2005 (JP) ................. 2005-192863

(51) Int. Cl.
*H05K 1/16* (2006.01)

(52) U.S. Cl. ........................ 174/260; 174/262

(58) Field of Classification Search ............... 174/260, 174/261, 262
See application file for complete search history.

(56) References Cited

U.S. PATENT DOCUMENTS

| | | | | |
|---|---|---|---|---|
| 5,329,423 | A * | 7/1994 | Scholz | 361/760 |
| 5,959,353 | A | 9/1999 | Tomita | |
| 6,046,910 | A * | 4/2000 | Ghaem et al. | 361/760 |
| 6,256,207 | B1 | 7/2001 | Horiuchi et al. | |
| 6,443,351 | B1 | 9/2002 | Huang et al. | |
| 6,461,953 | B1 | 10/2002 | Sakuyama et al. | |
| 6,719,185 | B2 * | 4/2004 | Suzuki | 228/173.1 |
| 6,753,480 | B2 * | 6/2004 | Maa et al. | 174/255 |
| 6,809,268 | B2 | 10/2004 | Hayashi et al. | |
| 6,822,170 | B2 | 11/2004 | Takeuchi et al. | 174/258 |
| 6,933,448 | B2 | 8/2005 | Maa et al. | |
| 7,087,991 | B2 * | 8/2006 | Chen et al. | 257/700 |
| 7,189,927 | B2 | 3/2007 | Sakuyama | |
| 7,279,771 | B2 * | 10/2007 | Sunohara et al. | 257/516 |
| 7,452,797 | B2 * | 11/2008 | Kukimoto et al. | 438/612 |
| 2003/0070835 | A1 | 4/2003 | Maa et al. | |
| 2003/0214795 | A1 * | 11/2003 | Sakuyama | 361/767 |
| 2004/0209451 | A1 | 10/2004 | Kukimoto et al. | |
| 2005/0035451 | A1 | 2/2005 | Liu et al. | |
| 2005/0248037 | A1 * | 11/2005 | Hung et al. | 257/778 |
| 2006/0244142 | A1 | 11/2006 | Waidhas | |

FOREIGN PATENT DOCUMENTS

| | | |
|---|---|---|
| DE | 101 38 042 A1 | 11/2002 |
| JP | 59-996 | 1/1984 |
| JP | 5-121411 | 5/1993 |
| JP | 11-40908 | 2/1999 |
| JP | 2002-208778 | 7/2002 |
| JP | 2002-217531 | 8/2002 |
| JP | 2004-179578 | 6/2004 |
| JP | 2004-207370 | 7/2004 |
| JP | 2004-319676 | 11/2004 |

* cited by examiner

*Primary Examiner* — Ishwarbhai Patel

(74) *Attorney, Agent, or Firm* — Oblon, Spivak, McClelland, Maier & Neustadt, L.L.P.

(57) ABSTRACT

A printed wiring board includes a wiring substrate, one or more conductor circuits provided on the wiring substrate, a solder resist layer provided on a surface of the wiring substrate and having multiple openings, the openings exposing multiple parts of the conductor circuits forming multiple conductor pads for mounting electronic parts, and multiple solder bumps formed on the conductor pads, respectively. The conductor pads are aligned at a pitch of about 200 μm or less, and a ratio W/D of a diameter W of the solder bumps to an opening diameter D of the openings formed in the solder resist layer is about 1.05 to about 1.7.

10 Claims, 10 Drawing Sheets

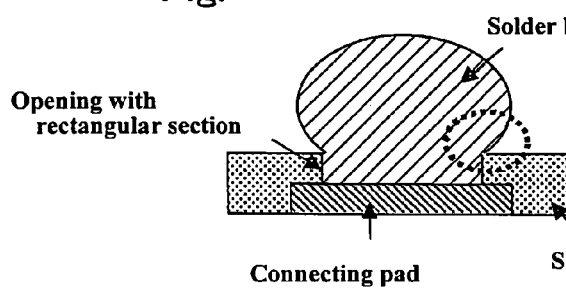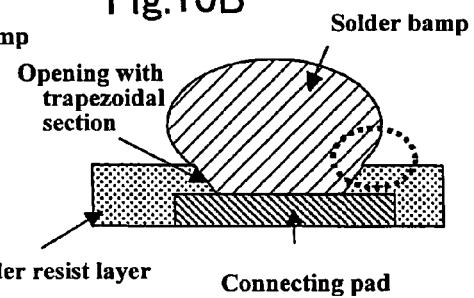
Fig.10A Opening with rectangular section — Solder bamp — Connecting pad — Solder resist layer
Fig.10B Opening with trapezoidal section — Solder bamp — Connecting pad
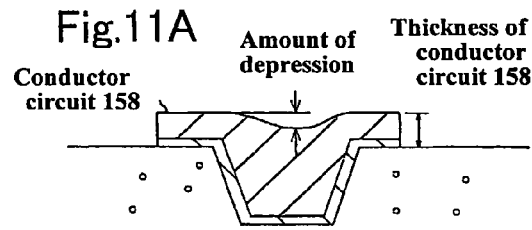
Fig.11A Conductor circuit 158 — Amount of depression — Thickness of conductor circuit 158
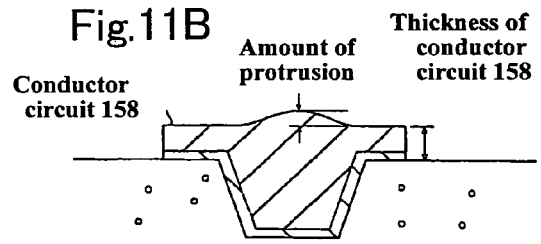
Fig.11B Conductor circuit 158 — Amount of protrusion — Thickness of conductor circuit 158

Connecting pad

Connecting pad x·y = Connecting pad area

PRINTED WIRING BOARD

CROSS REFERENCE TO RELATED APPLICATION

The present invention is an application claiming priority of JP No. 2005-192863 filed of Jun. 30, 2005, the disclosure of which is incorporated herein by reference in its entirety.

TECHNICAL FIELD

The invention relates to a printed wiring board for mounting electronic parts such as capacitors, ICs and the like on the surface layer, and more particularly relates to a printed wiring board adaptable for narrow pitching of solder bumps for mounting electronic parts.

BACKGROUND ART

First, in case of mounting semiconductor elements such as IC chips and the like on printed wiring board, first, solder bumps are formed for semiconductor element mounting pads (hereinafter, merely referred to as "conductor pad") formed on the printed wiring board. A part of the conductor pad is covered with a solder resist layer, and the center portion of the conductor pad is only exposed. In order to form a solder bump for such conductor pad, first, the printed wiring board is set in a solder paste printer, then a solder printing mask such as metal mask, plastic mask and the like (provided with an opening for printing corresponding to the conductor pad formed in the printed wiring board) is laminated on the printed wiring board, and alignment of an alignment mark formed in the printed wiring board and an alignment mark of the mask for printing is carried out.

And, after printing solder paste on the conductor pad and removing the mask for printing from the printed wiring board, a solder bump is formed on the conductor pad by carrying out a reflow treatment by setting the printed wiring board on a reflow device (refer to as Japanese unexamined patent publication No. H11-40908).

BRIEF SUMMARY OF THE INVENTION

According to one embodiment of the present invention, there is provided a printed wiring board comprising a wiring substrate formed with a conductor circuit, a solder resist layer provided on the surface thereof, a conductor pad formed from a part of the conductor circuit exposed from an opening provided in the solder resist layer for mounting electronic parts and a solder pad formed on the conductor pad, wherein the conductor pad is aligned with a pitch of about 200 μm or less, and the ratio (W/D) of a solder bump diameter W to an opening diameter D of the opening provided in the solder resist layer is about 1.05 to about 1.7.

Further, according to other embodiment of the present invention, there is provided a printed wiring board comprising a wiring substrate formed with a conductor circuit, a solder resist layer provided on the surface thereof, a conductor pad formed from a part of the conductor circuit exposed from an opening provided in the solder resist layer for mounting electronic parts, a solder pad formed on the conductor pad and an under fill for mounting electronic parts through the solder bump and resin sealing between the electronic parts and the solder resist layer, wherein the conductor pad is aligned with a pitch of about 200 μm or less, and the ratio (W/D) of the solder bump diameter W to the opening diameter D of the opening provided in the solder resist layer is about 1.05 to about 1.7.

In the embodiment of the present invention, it is preferable that the ratio (W/D) of the solder bump diameter W to the opening diameter D of the opening provided in the solder resist layer is about 1.05 to about 1.5.

Further, in the embodiment of the present invention, it is preferable that an opening is formed into a tapered form in which an opening diameter D1 at the top face of the opening provided in the solder resist layer is larger than an opening diameter D2 at the bottom face.

Further, in the embodiment of the present invention, to the surface of the solder resist layer can be applied a flattening treatment in at least an electronic parts mounting region, and the flattened surface preferably has maximum surface roughness of about 0.8 μm to about 3.0 μm.

Further, in the embodiment of the present invention, to the surface of the flattened solder resist layer can be applied a roughening treatment, and the surface of the roughened solder resist layer is preferably smaller than the maximum surface roughness of the flattened surface and about 0.2 μm to about 0.5 μm at an arithmetic mean roughness (Ra).

Further, in the embodiment of the present invention, it is preferable that the conductor pad defined as a part of the conductor circuit exposed from the opening provided in the solder resist layer is formed into a filled via completely filled within an opening provided in an interlayer resin insulating layer where a plated conductor is positioned at an outermost layer, and that an uneven amount of the filled via surface exposed from the interlayer resin insulating layer surface is about −5 μm to about +5 μm in relation to the thickness of the conductor circuit formed on the interlayer resin insulating layer.

Further, in the embodiment of the present invention, "conductor pad" defined as a part of the conductor circuit exposed from the opening provided in the solder resist layer, its conductor circuit is formed into, for instance, connecting pad, via hole (including filled via completely filling a plated conductor within the opening provided in the resin insulating layer) or a conductor circuit connected to the via hole, so that in a wide sense, it is defined as apart of the conductor circuit including the connecting pad and the via hole.

Further, in the embodiment of the present invention, "solder bump diameter" means the maximum value among a length of the circle or a length of the oval appeared in case of cutting the solder bump protruded from the solder resist layer surface crosswise at horizontal section.

Further, in the embodiment of the present invention, "opening diameter (D)" of the opening provided in the solder resist layer means "diameter" when an opening side wall is not tapered and means opening diameter (of the upper part) appeared on the solder resist layer surface when the opening side wall is tapered.

Further, in the embodiment of the present invention, "maximum surface roughness" means, as schematically shown in FIG. 8, the maximum value among differences X1, X2, X3, X4, X5 ... between a height of the solder resist layer on the adjacent conductor pad or conductor circuit and that of the solder resist layer of the adjacent conductor pad non-forming portion or conductor circuit non-forming portion.

Further, "arithmetic mean roughness" means arithmetic mean roughness (Ra) defined by JIS 80601.

Further, the disclosure of JIS 80601 is incorporated herein by reference in its entirety.

BRIEF DESCRIPTION OF THE DRAWINGS

FIG. 10A is a schematic view explaining the bump form around a boundary between the solder bump and the solder resist layer surface when the solder resist layer opening is rectangular in section, and FIG. 10B is a schematic view explaining the bump form around a boundary between the solder bump and the solder resist layer surface when the solder resist layer opening is trapezoidal in section.

FIGS. 11A and 11B are schematic views explaining unevenness of the filled via as a connecting pad.

DETAILED DESCRIPTION OF EMBODIMENTS

Figure 9:
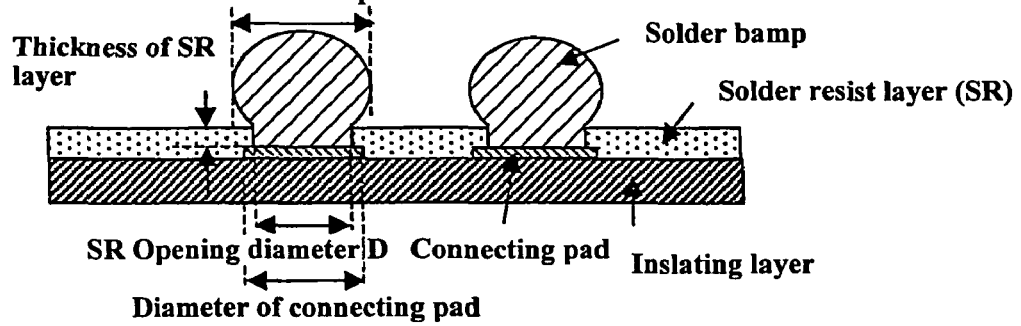
FIG. 9 is a schematic view explaining relation between the solder bump diameter (W) and the solder resist layer opening diameter (D) in the invention.

One embodiment of the printed wiring board of the present invention will be described hereinafter. In the printed wiring board, as shown in FIG. 9, at least one opening is provided in a solder resist layer (SR layer) formed in the outermost layer of a wiring substrate, a part of a conductor circuit exposed from the at least one opening is formed as conductor pads for mounting electronic parts, the conductor pads are arranged with a pitch of about 200 μm or less, and solder bumps are formed on the respective conductor pads in the form of filled viaholes each completely filled in the opening, and further the ratio (W/D) of a solder bump diameter W to a diameter D of the opening provided in the solder resist layer is about 1.05 to about 1.7.

In the embodiment of the present invention, for forming the respective solder bumps in the corresponding openings provided in the solder resist layer, it is desirable to use a novel method and a device for dropping solder balls having very fine particle diameter on the connecting pads through the corresponding openings of a ball aligning mask as described below, without employing a printing method with the use of a conventional mask.

First, a novel solder ball mounting method and a device thereof are used for manufacturing. As to the printed wiring board of the present invention, the construction of one embodiment is explained by referring to FIGS. 1 and 2.

Figure 1:
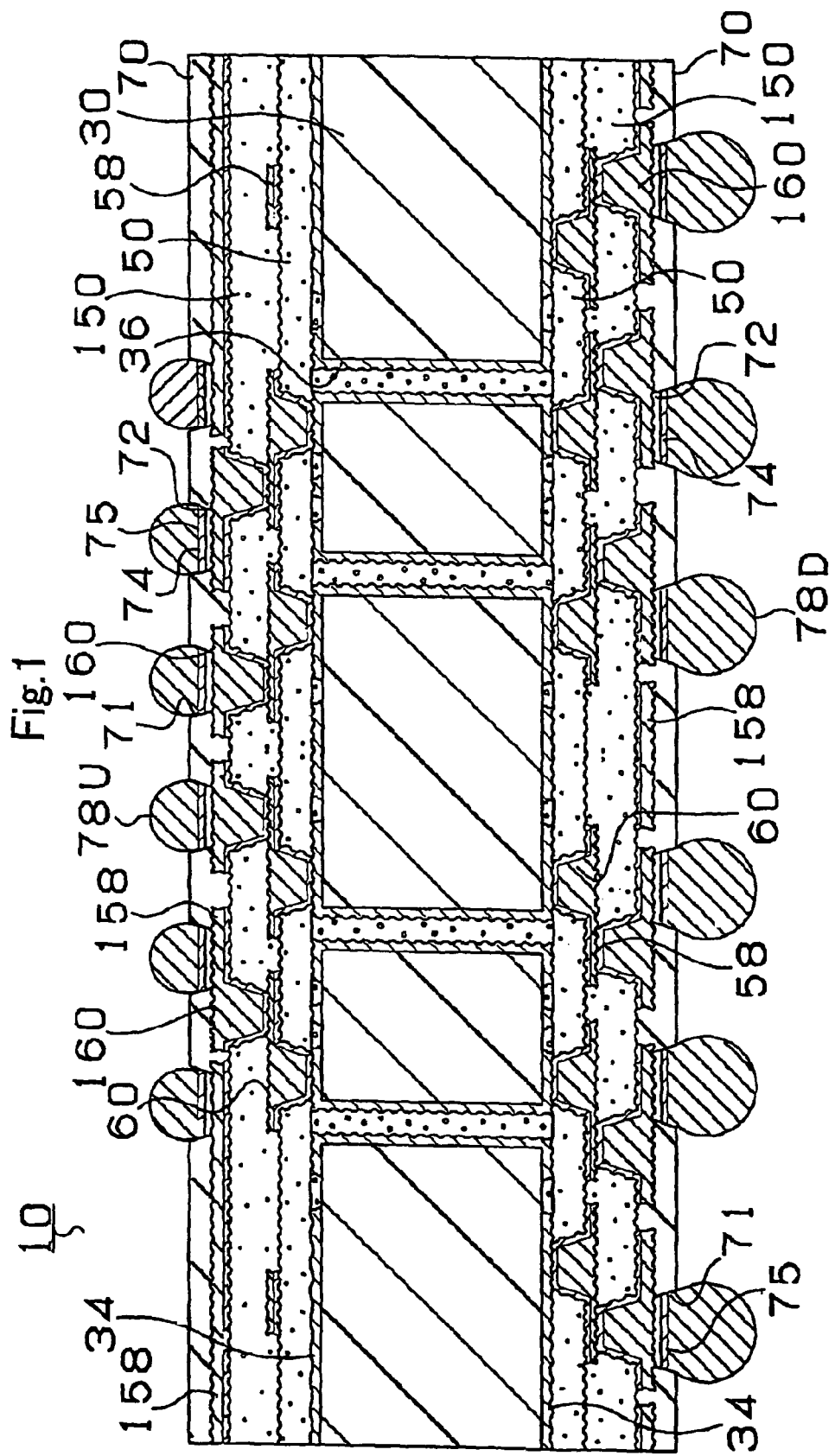
FIG. 1 is a sectional view of a printed wiring board according to the invention.
Figure 2:
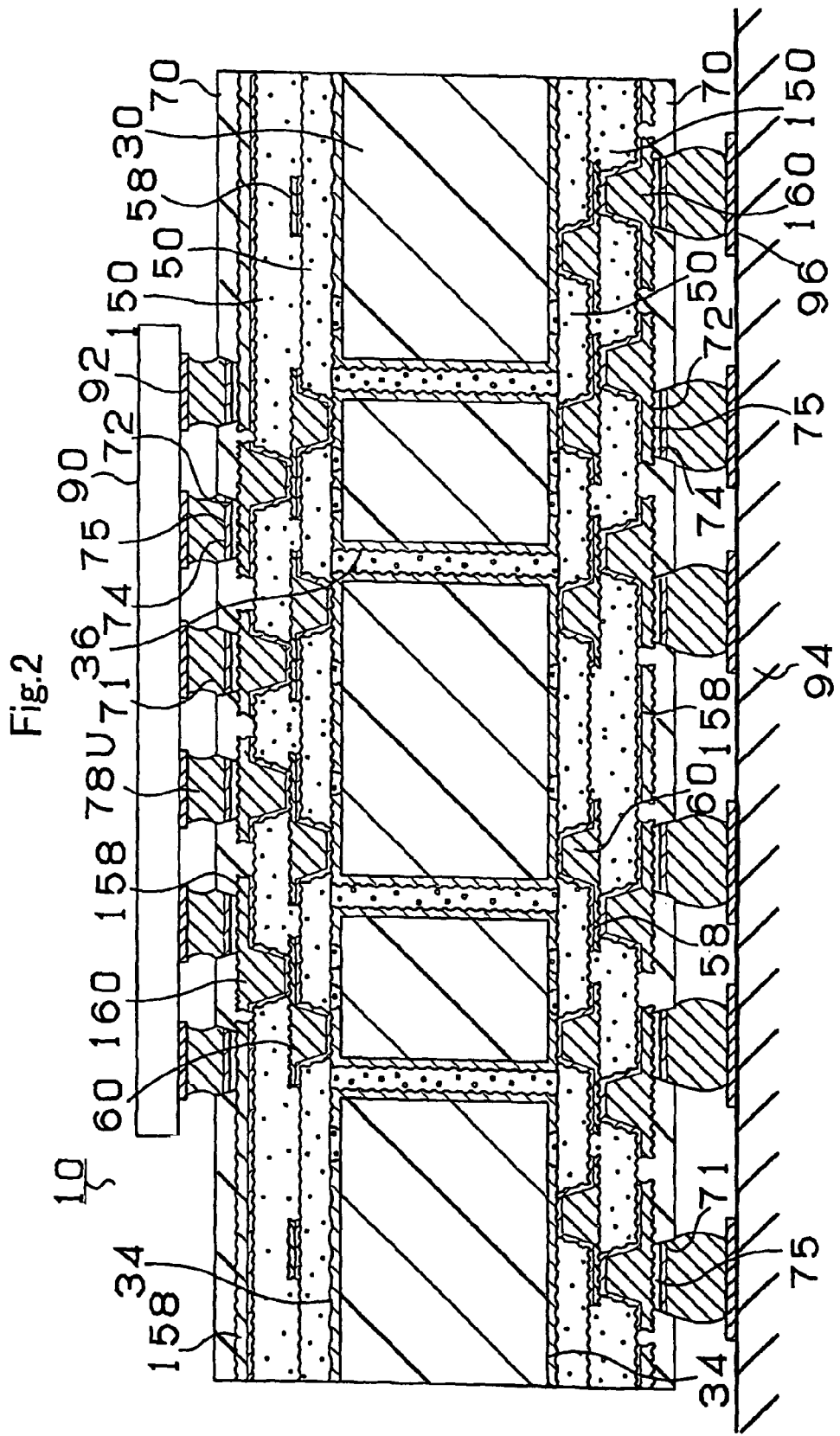
FIG. 2 is a sectional view showing the state of mounting IC chip on the printed wiring board shown in FIG. 1 and placing them on a daughter board.

FIG. 1 shows a sectional view of a printed wiring board 10, and FIG. 2 shows a state in which an IC chip 90 is mounted on the printed wiring board 10 and the printed wiring board 10 is mounted on a daughter board 94. As shown in FIG. 1, the printed wiring board 10 has a conductor circuit 34 formed on both surfaces of a core substrate 30, and the respective conductor circuits are electrically connected through a plated through hole 36.

Further, on the conductor circuit 34 of the core substrate 30 is formed a conductor circuit 58 forming a conductor circuit layer through an interlaminar insulative resin layer 50. The conductor circuit 58 is connected to the conductor circuit 34 through via hole 60. On the conductor circuit 58 is formed a conductor circuit 158 through an interlaminar insulative resin layer 150. The conductor circuit 158 is connected to the conductor circuit 58 through a via hole 160 formed in an interlaminar insulative resin layer 150.

A solder resist layer 70 is formed by covering the conductor circuit 158 and the via hole 160, and a connecting pad 75 is formed by forming a nickel plated layer 72 and a gold plated layer 74 on an opening 71 provided in the solder resist layer 71. On the connecting pad 75 of the top face is formed a solder bump 78U and on the connecting pad 75 of the bottom face is formed a BGA (ball grid array) 78D.

As shown in FIG. 2, the solder bump 78U on the upper side of the printed wiring board 10 is connected to an electrode 92 of the IC chip 90 to form an IC mounted printed wiring board, and the IC mounted printed wiring board is connected to a land 96 of a daughter board 94 through the BGA 78D.

In the embodiment of the invention, it is desirable that the conductor pad is provided with a pitch of about 200 μm or less, and the ratio (W/D) of a solder bump diameter W to an opening diameter D of the opening provided in the solder resist layer is made within a range of about 1.05 to about 1.7, preferably about 1.05 to about 1.5, thereby making a gap difficult to be formed between the solder bump and the opening side wall of the solder resist layer, so as to make flux residue and clearing solution residue difficult to remain between the solder bump and the solder resist layer. As a result, it becomes possible to prevent lowering of insulation resistance and peeling of the under fill caused by residue, thereby insulation reliability and connection reliability are easily improved.

Further, in the embodiment of the invention, it is desirable to flatten the solder resist layer surface to secure flatness to some extent. Such flattened surface can increase the volume of the solder resist layer to which large stress is applied, and decrease the bending portion on which stress tends to concentrate. As a result, heat cycle resistance can easily be improved.

It is desirable that the surface of the solder resist layer corresponding to at least electronic parts mounting region is flattened. The solder resist layer and the solder bump are different in thermal expansion coefficient, so that there are produced repeatedly contraction and expansion at the boundary vicinity between the solder bump and the solder resist layer. And, when large unevenness is existent on the solder resist layer surface, i.e. small flatness, the volume of the solder resist layer in the bump vicinity is small to be easily broken. Therefore, by making flatness of the solder resist layer surface small to some extent, the volume of the solder resist layer where large stress is applied to is increased, bending portion where stress tends to concentrate is lessened, and heat cycle resistance can easily be improved.

To the solder resist layer surface is desirably applied flattening treatment in, for instance, at least electronic parts mounting region. As thermal expansion coefficient of the solder resist layer and the solder bump are different, contraction and expansion are repeated in the vicinity of the solder bump and the solder resist layer by thermal change. When large unevenness is existent on the solder resist layer surface, that is, small flatness, the volume of the solder resist layer in the vicinity of the solder bump is less, breakdown tends to occur. Therefore, the volume of largely stressed portion of the solder resist layer is increased by lessening flatness of the solder resist layer surface to some extent and the stress-concentrating bent portion is lessened, so as to improve heat cycle resistance.

The flattened surface of the solder resist layer is desirably about 0.8 to about 3.0 μm in maximum surface roughness. The reason is that when the maximum surface roughness is within a range of about 0.8 to about 3.0 μm, crack is hardly generated in the solder resist in the vicinity of the conductor pad, and air (void) is hard to enter into the under fill resin. As a result, insulation reliability and connection reliability are easily improved.

Further, in the embodiment of the present invention, it is desirable to further apply a roughening treatment to the flattened surface of the solder resist layer.

Wettability of the under fill resin is easily improved by applying the roughening treatment to the surface of the solder resist layer flattened to some extent, so that under fill resin can be filled in a narrow gap portion in the boundary vicinity between the solder resist layer and the solder bump so as to improve connection reliability.

It is desirable that the roughened surface of the solder resist layer is smaller than the maximum surface roughness of the flattened surface and about 0.2 to about 0.5 μm at an arithmetic mean roughness (Ra).

The reason is that when the arithmetic mean roughness Ra is made within a range of about 0.2 to about 0.5 μm, adhesion to the under fill resin can be increased, and flux residue and cleaning residue are hardly remained on the solder resist surface. As a result, insulation reliability and connection reliability are easily improved.

Further, in the embodiment of the invention, an opening side wall of the solder resist layer is tapered, thereby hardly concentrating stress because a form of the solder bump is not extremely changed at the opening periphery. As a result, connection reliability is improved.

An opening provided in the solder resist layer may be, as shown in FIGS. 10A to 10B for instance, rectangular or trapezoidal in section. Particularly, in case of the trapezoidal section, the solder bump portion filled in the opening and that exposed to the outside are smoothly continued, and the bent portion of the solder bump becomes small in the boundary with the solder resist layer, that is, the form of the solder bump is not extremely changed at the boundary portion with the solder resist layer so as not to concentrate stress. As a result, the solder bump is hard to be broken and connection reliability is improved.

Further, when an opening diameter at the top face is made D1 and that at the bottom face is made D2, it is desirable that the shape of the opening may be a trapezoid in section wherein the difference between the opening diameters D1-D2 is about 5 μm to about 20 μm. When the difference D1-D2 is within such range, stress by thermal expansion coefficient difference between IC chip and print wiring board is hardly concentrated, so that connection reliability tends to be improved, and insulation performance between adjacent solder bumps can be secured. Further, migration is scarcely generated.

Further, as understood from FIGS. 1 and 2, two connecting pads positioned at center among connecting pads 75 provided on the top face are formed into the form of a land just above a via hole 160, and two connecting pads adjacent thereto are formed into the form of a pad adjacent to the land of the via hole 160, further, two connecting pads positioned at both ends are formed into the form of a pad consisting of a part of a wiring pattern of the conductor circuit 158, and solder bumps are formed on these connecting pads.

In like manner, two connecting pads among connecting pads 75 on the bottom face are formed into a land just above the via hole 160, and four connecting pads positioned at center are formed into a pad adjacent to the via hole 160.

The viahole 160 as a connecting pad formed by the solder bump 78U is preferably a filled-via, and the uneven amount of the filled-via surface exposed from the surface of the interlaminar insulative resin layer 150 is, as shown in FIGS. 11A to 11B, desirably within a range of about −5 μm to about +5 μm in relation to the surface thickness of the conductor circuit 158. The reason why the depressed or protruded amount of the filled-via surface is restricted to a mentioned above is due to the fact that when the depressed amount is about 5 μm (−5 μm) or less, the number of contact point defined by the solder ball and the connecting pad consisting of the filled-via is secured, and wettability in case of forming the solder bump is easily improved, and entanglement of voids within the bump and missing bump can be controlled, while when the protruded amount of the filled-via surface is about 5 μm (+5 μm) or less, the thickness of the conductor circuit 158 is controlled not to become large but easily adaptable for micro-patterning.

Further, the "electronic parts mounting region" in the embodiment of the invention substantially corresponds to a region (hereinafter, simply called as "connecting pad region") where conductor pads such as filled-via and the like for mounting electronic parts are provided.

Figure 12A:
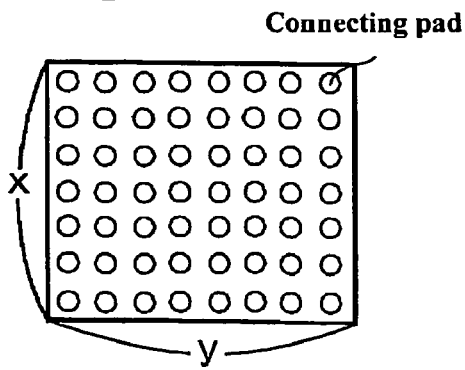
FIGS. 12A and 12B are schematic views explaining a connecting pad region.
Figure 12B:
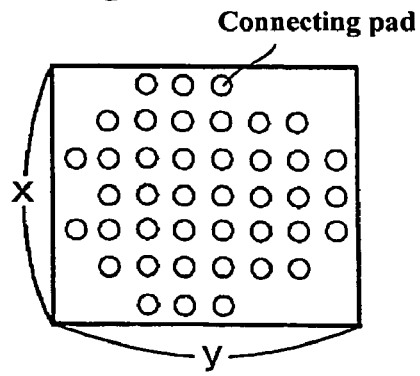

For example, FIG. 12A shows a state of aligning all of the outermost peripheral connecting pads along each side of a rectangle among grid-like aligned connecting pads, and FIG. 12B shows a state of not aligning a part of the outermost peripheral connecting pads along each side of the rectangle, however, in either case, when the connecting pad region is made rectangle, a rectangle region determined to minimize an area of the region enclosing all connecting pads is called as "connecting pad region".

Figure 3A:
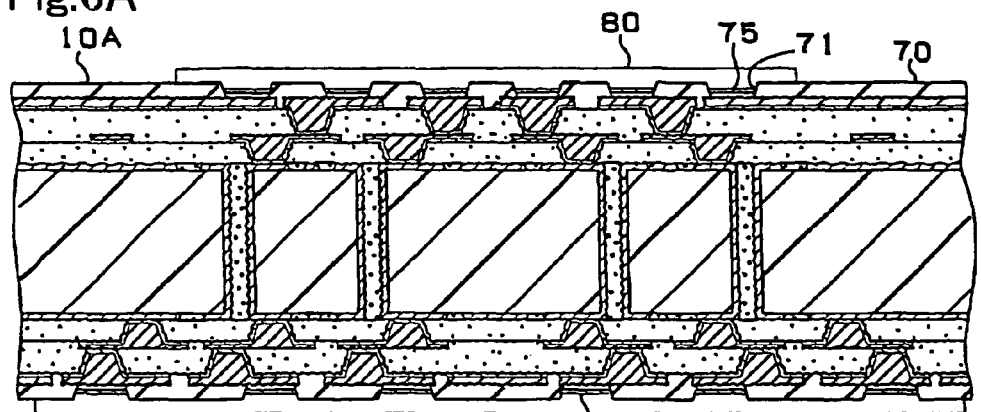
FIGS. 3A to 3C are views explaining a process of forming solder bumps on the printed wiring board.
Figure 3B:
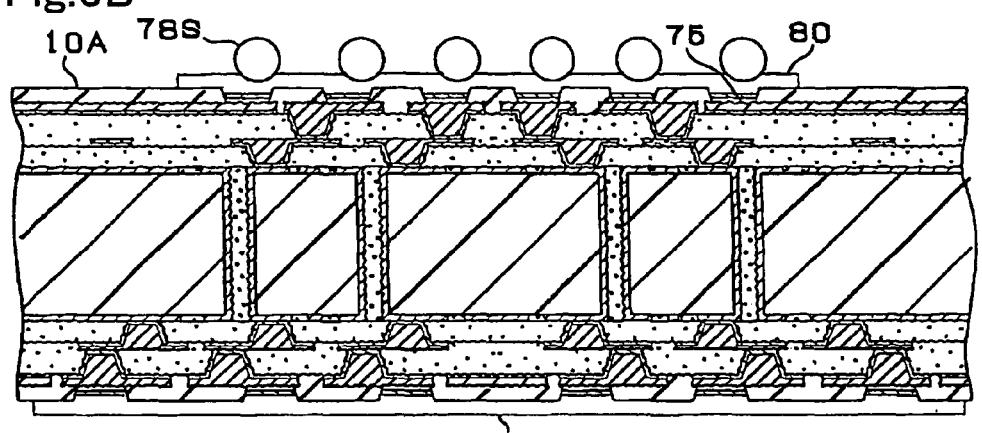
Figure 3C:
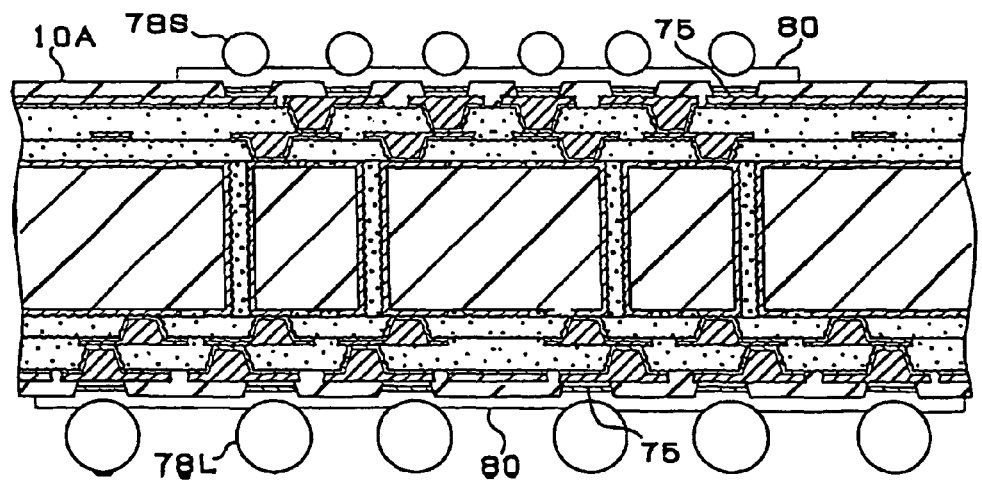

FIGS. 3A to 3C are views explaining the steps for forming the solder bumps on the printed wiring board 10 according to the present invention.

First, a flux layer 80 is formed for covering conductor pads formed in the openings 71 provided in the solder resist layer 70 on the top face side of the printed wiring board, i.e. the connecting pads 75 by a printing method (see FIG. 3A). Next, on the connecting pads 75 on the top face side of the printed wiring board are mounted very small solder balls 78s (for example, made by Hitachi Metals or Tamura) with the use of a solder ball loader described later on (see FIG. 3B). Such solder ball is desirable about 40 μm or more and less than about 200 μm in diameter. When the diameter is made within such range, each solder ball easily drops on the corresponding connecting pad because it is not too light in weight, and the solder balls are easily assembled in a cylinder member, thereby to control the presence of connecting pads with no solder balls mounted thereon. In order to match for the fine patterning, the solder ball having a diameter of about 80 μm or less is desirable. Thereafter, solder balls 78L of a usual diameter (250 μm) are adsorbed and placed on the connecting pads 75 on the bottom face side of the printed wiring board with the use of an adsorption head as described in Japanese Patent No. 1975429, for instance (see FIG. 3C).

Next, by heating in a reflow furnace to form, 500 pieces to 30,000 pieces of the solder bumps 78U are formed with a pitch of about 60 to about 200 µm on the top face side of the printed wiring board 10 as shown in FIG. 1, and 250 pieces of BGA 78D are formed with a pitch of about 2 mm on the bottom face side, for instance.

The pitch of the solder bumps corresponds to a pitch of the connecting pads, and when the pitch of the connecting pads is about 60 µm or more, manufacture of solder balls suitable for the pitch becomes possible. When the pitch of the connecting pads is about 200 µm or less, it becomes possible to obtain a printed wiring board adaptable for fine patterning or narrow pitching.

Further, as shown in FIG. 2, an IC mounted printed wiring board 10 is formed by mounting the IC chip 90 through the solder bumps 78U by reflowing, and this IC mounted printed wiring board 10 is mounted on the daughter board 94 through BGA 78D.

Figure 4A:
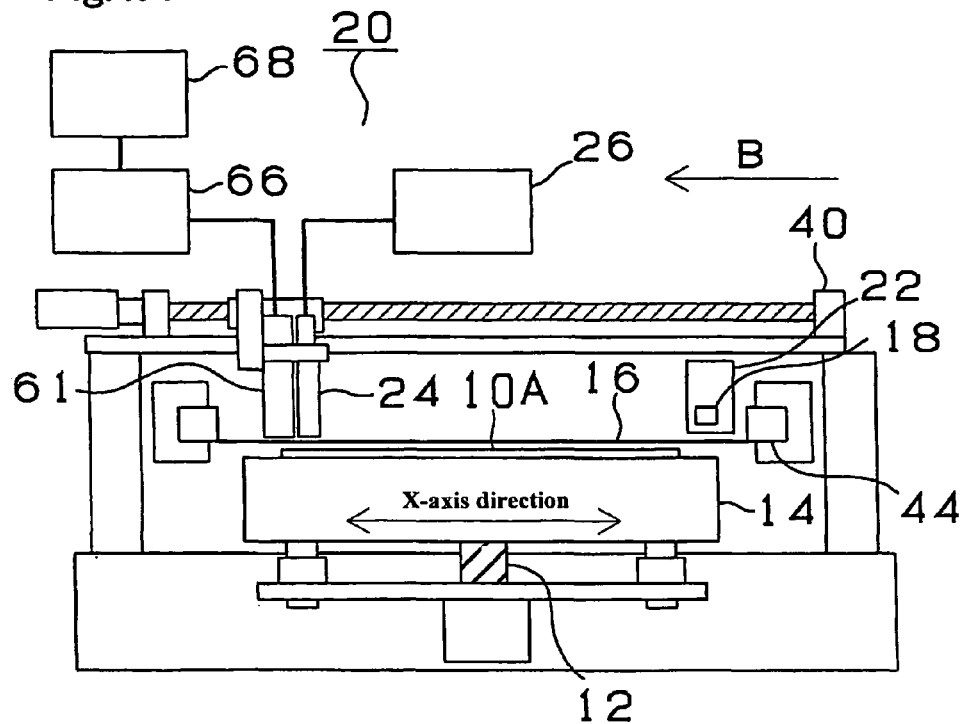
FIGS. 4A and 4B are schematic views showing the construction of a solder ball mounting device.
Figure 4B:
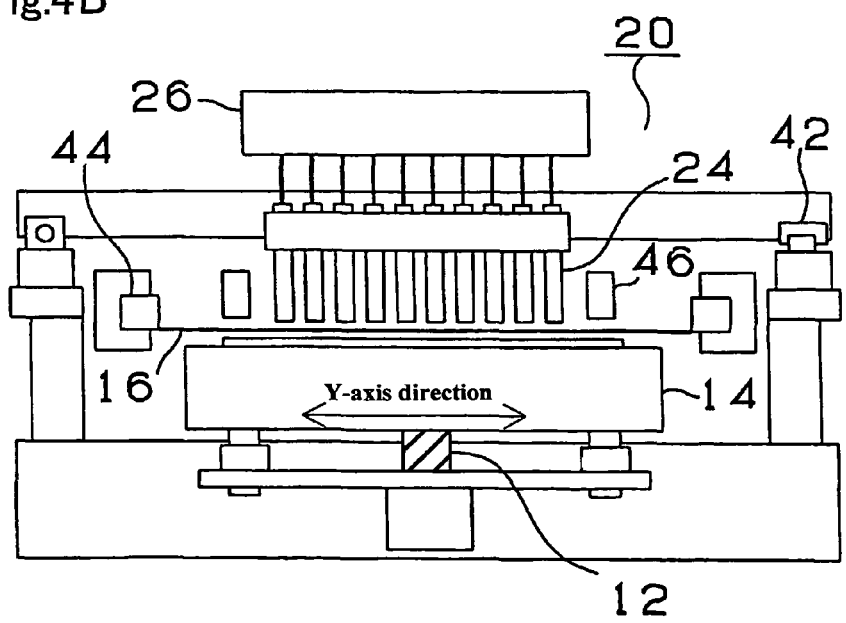

Next, the solder ball loader for mounting the very small solder balls 78s on the corresponding connecting pads of the above-described printed wiring board is explained by referring to FIGS. 4A to 4B.

FIG. 4A is an illustration showing the structure of the solder ball loader, and FIG. 4B is a view taken from an arrow B of the solder ball loader of FIG. 4A.

The solder ball loader 20 comprises an XYθ suction table 14 for positioning and holding the printed wiring board 10, a shaft 12 for moving the XYθ suction table 14 up and down, a ball aligning mask 16 with an opening corresponding to the connecting pad 75 of the printed wiring board, a mounting cylinder (cylinder member) 24 for guiding the solder balls moving on the ball aligning mask 16, a suction box 26 for giving negative pressure to the mounting cylinder 24, a solder ball removing cylinder 61 for recovering excessive solder balls, a suction box 66 for giving negative pressure to the solder ball removing cylinder 61, an adsorbed ball removing and adsorbing device 68 for holding the collected solder balls, a mask clamp 44 for clamping the ball aligning mask 16, an X-axis direction moving shaft 40 for sending the mounting cylinder 24 and the solder ball removing cylinder 61 to the X-axis direction, a moving shaft supporting guide 42 for supporting the X-axis direction moving shaft 40, an alignment camera 46 for taking an image of the multilayer printed wiring board 10, a residue detecting sensor 18 for detecting residual amount of the solder balls under the mounting cylinder 24 and a solder ball supplier 22 for supplying solder balls to the side of the mounting cylinder 24 based on the residue detected by the residue detecting sensor 18.

A plurality of the mounting cylinders 24 and the solder ball removing cylinder 61 are arranged in the Y-axis direction by corresponding to size of the connecting pad regions. Further, the size may correspond to a plurality of the connecting pad areas. Here, the Y-axis direction is expedient and may be aligned in the X-axis direction. The XY θ suction table 14 functions as positioning, adsorption, maintenance and correction of the solder ball mounted printed wiring board 10. The alignment camera 46 detects an alignment mark of the printed wiring board 10 on the XY θ suction table 14 to regulate a position between the printed wiring board and the ball aligning mask 16 based on the detected position. The residue detecting sensor 18 detects the residue of the solder balls by an optical method.

Figure 5A:
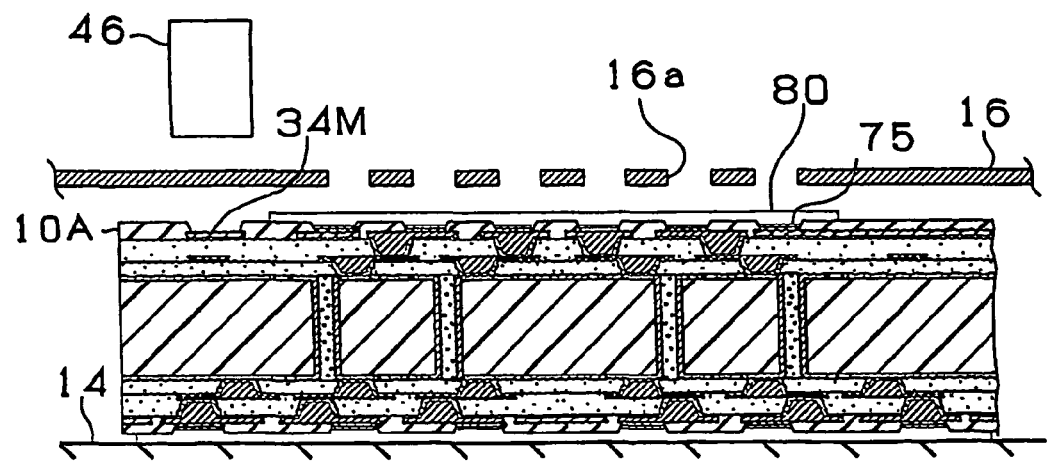
FIG. 5A is a schematic view explaining alignment of the printed wiring board.

Next, a process for mounting the solder balls by the solder ball loader 20 will be explained by referring to FIGS. 5 to 7.
(1) Position Recognition and Correction of the PWB As shown in FIG. 5A, an alignment mark 34M of the printed wiring board 10 is recognized by the alignment camera 46, and the position of the printed wiring board 10 in relation to the ball aligning mask 16 is corrected by the suction table 14. That is, openings 16a of the ball aligning mask 16 are adjusted for corresponding to the connecting pads 75 of the printed wiring board 10 in position, respectively. In addition, here, for illustrating convenience' sake, the printed wiring board 10 for one is only shown, but actually, solder balls are mounted to a printed wiring board of worksheet size for constructing a plurality of wiring boards, and after forming solder bumps, the worksheet size board is cut into respective multilayer printed wiring boards.
(2) Solder Balls and Supply Thereof.

Figure 5B:
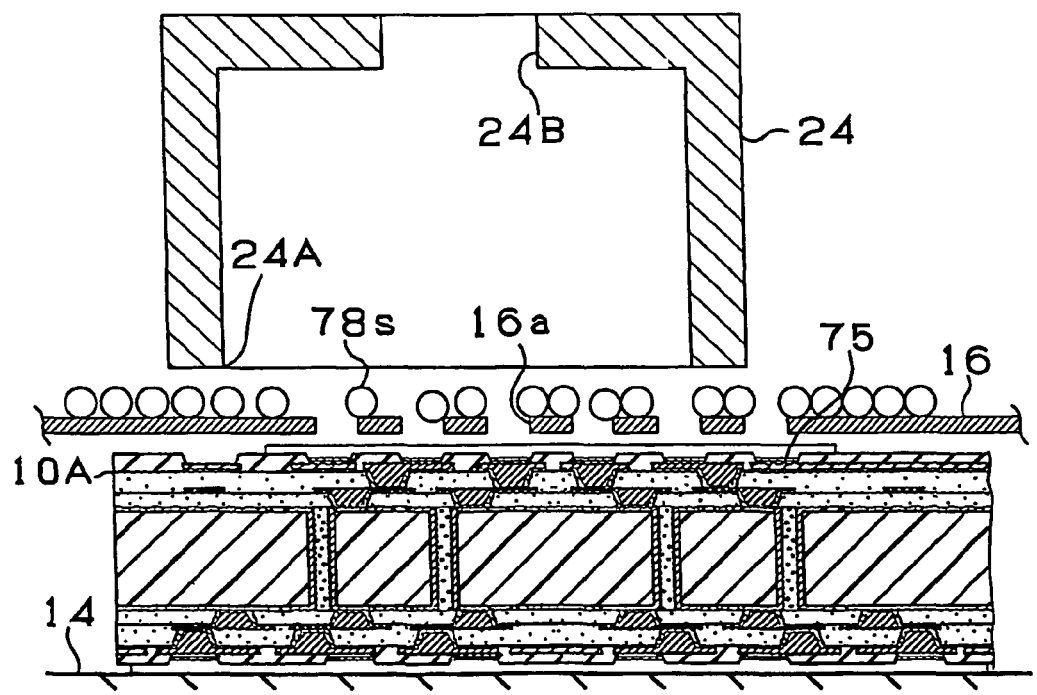
FIG. 5B is a schematic view explaining supply of the solder balls to mounting cylinders.

As shown in FIG. 5B, the solder balls 78s are quantitatively supplied from a solder ball supplying device 22 to the side of the mounting cylinder 24. Here, as the solder ball, use may be made of any commercial item (for example, made by Hitachi Metals) or, for example, solder balls may be manufactured according to the manufacturing device and method described in Japanese unexamined patent application No. 2001-226705.

Figure 6A:
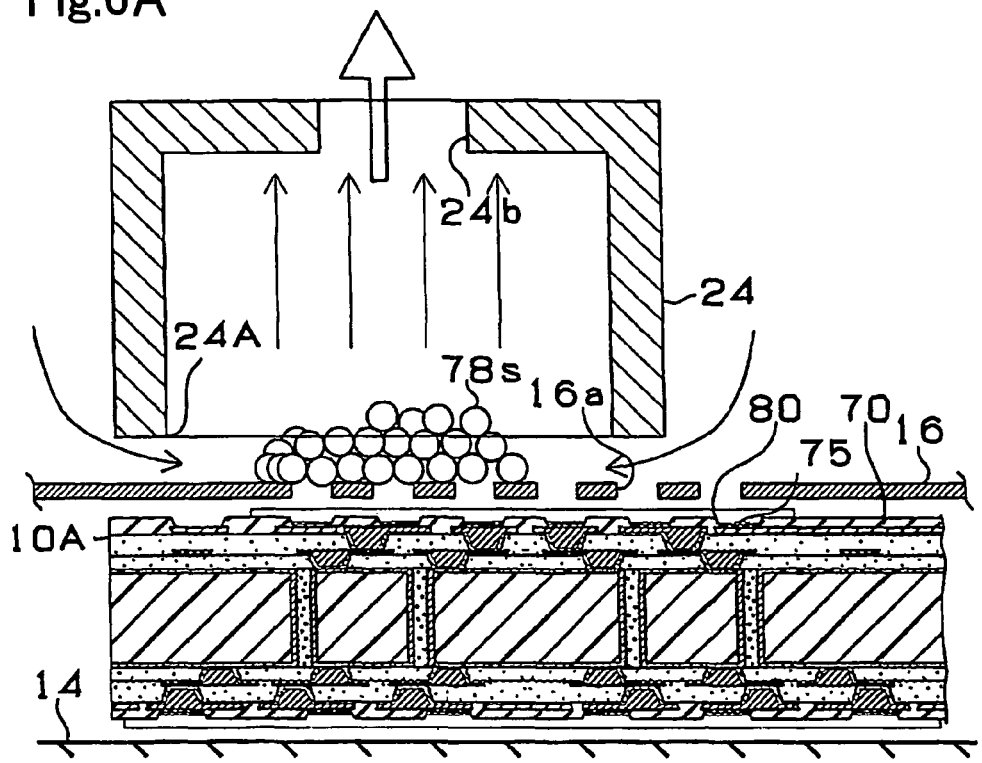
FIG. 6A is a schematic view explaining assembly of the solder balls by the mounting cylinders.

After manufactured, such solder balls are placed on a metal plate (e.g. nickel plate of about 25 µm thick) having a square slit (opening) which length and breadth are smaller than a desired diameter of the solder ball by about 1 µm, and the solder balls are rolled thereon and dropped from the slit. Then, small balls having smaller diameters than the desired ones are removed. Thereafter, the solder balls remained on the metal plate are classified by a metal plate having a square slit which length and breadth are larger than the desired diameter of the solder ball by about 1 µm, and solder balls dropped from the slit are collected so as to obtain the solder balls each having a diameter substantially equal to the desired diameter. The disclosure of Japanese unexamined patent application No. 2001-226705 is incorporated herein by reference in its entirety.
(3) Loading of Solder Balls As shown in FIG. 6A, on the upper part of the ball aligning mask 16 is positioned the mounting cylinder 24 by keeping predetermined clearance (e.g. about 50% to about 300% of a ball diameter), solder balls 78s are assembled on the ball aligning mask 16 right under the opening 24A of the mounting cylinder 24 by adsorbing air from the suction portion 24B at a running speed of about 5 m/sec to about 35 m/sec in a gap between the mounting cylinder and the printed wiring board.

Figure 6B:
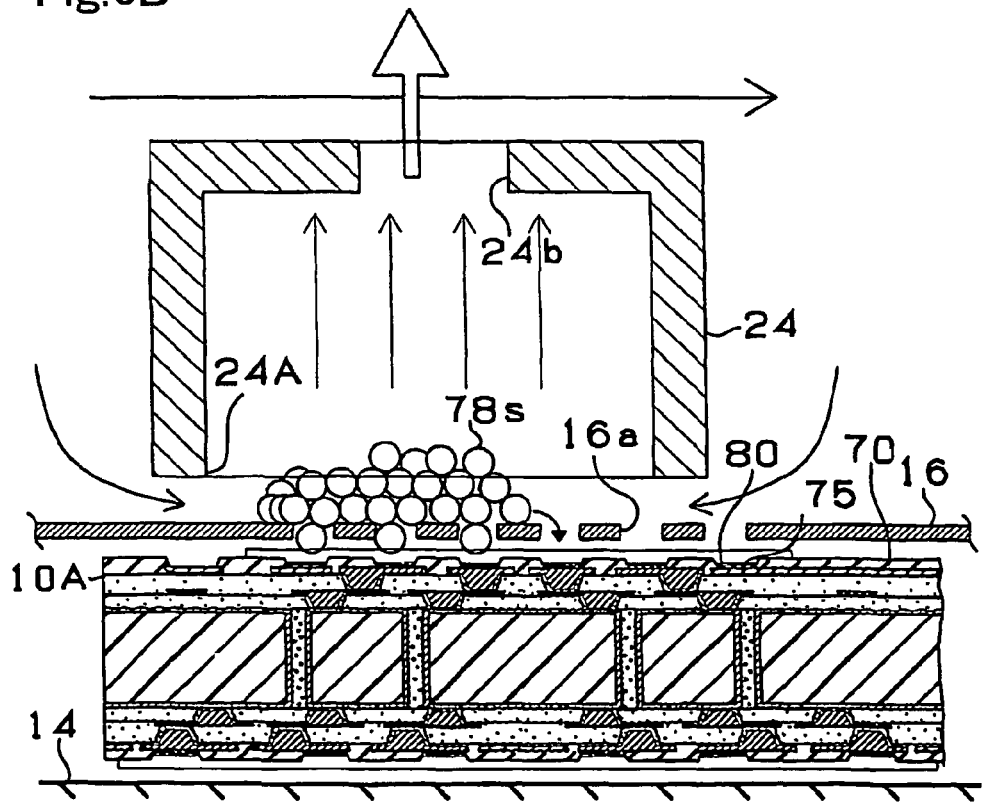
FIG. 6B is a schematic view explaining assembly and guide of the solder balls by the mounting cylinders.
Figure 7A:
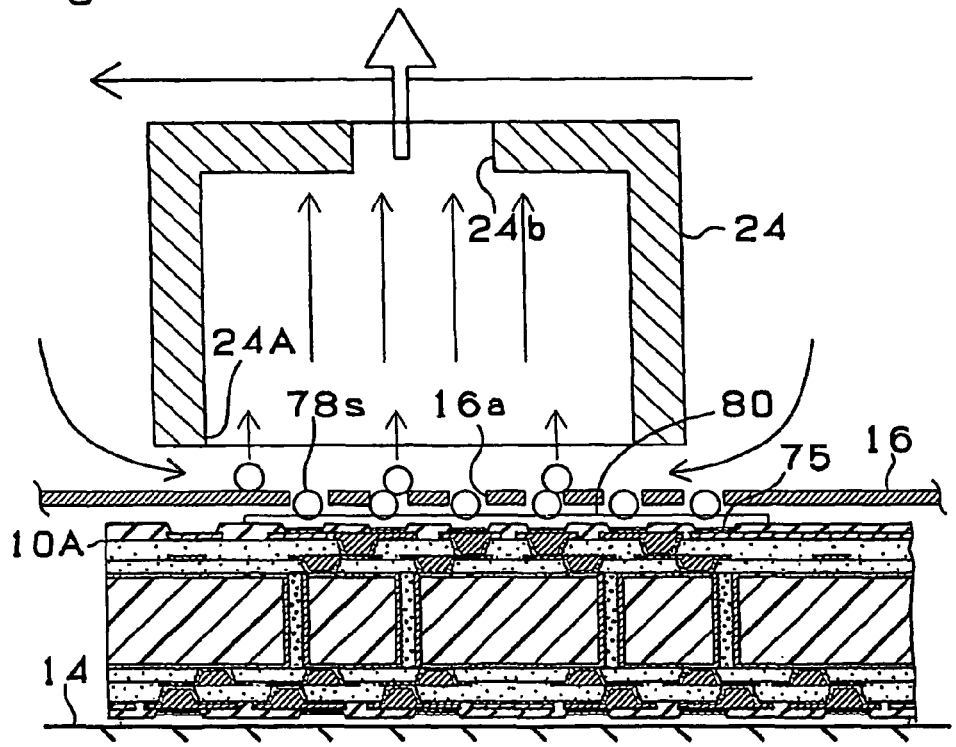
FIG. 7A is a schematic view explaining dropping of the solder balls to connection pads.
Figure 7B:
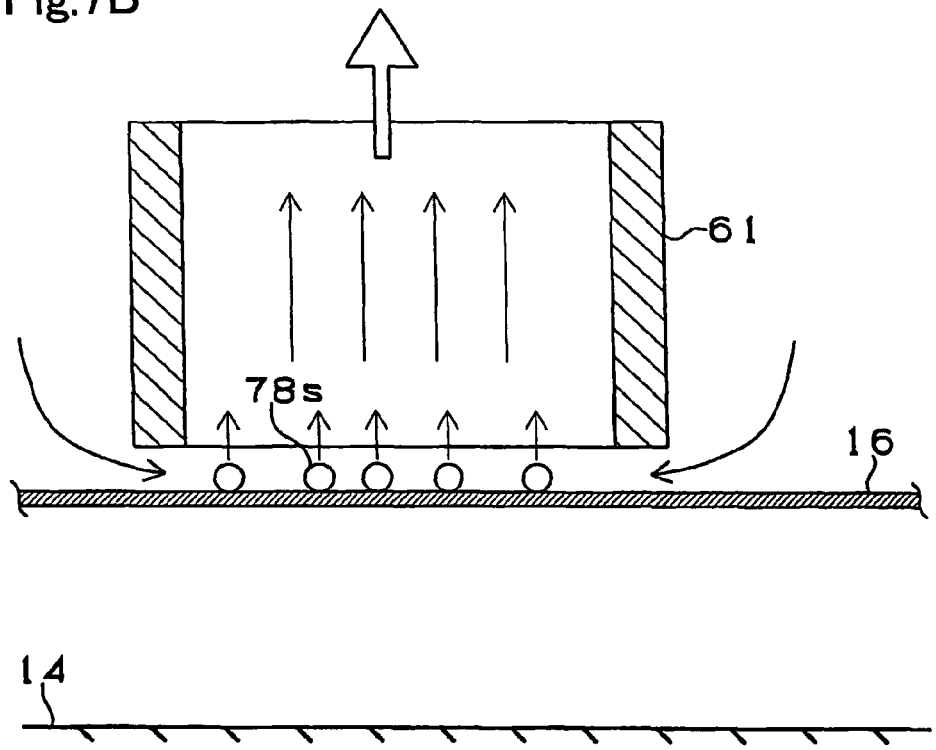
FIG. 7B is a schematic view explaining removal of the solder balls by adsorbed ball removing cylinders.

Thereafter, as shown in FIG. 6B and FIG. 7A, the mounting cylinders 24 aligned along the Y-axis direction of the printed wiring board 10 are sent to the horizontal direction along the X-axis direction by means of the X-axis moving shaft 40. Thereby, the solder balls 78s assembled on the ball aligning mask 16 are moved with the movement of the mounting cylinder 24, dropped to the corresponding connecting pads 75 of the printed wiring board 10 through the openings 16a of the ball aligning mask 16 and loaded. Thereby, the solder balls 78s are successively aligned on the whole connecting pads on the side of the printed wiring board 10.
(4) Removal of the Solder Ball As shown in FIG. 7B, the excessive solder balls 78s are guided to a place where no opening 16a is provided on the ball aligning mask 16, then adsorbed and removed by the solder ball removing cylinder 61.
(5) Removal of Wiring Board Then, the printed wiring board 10 is removed from the suction table 14.

According to the solder ball loading method and the solder ball loader as explained in the above, the solder balls 78s are assembled by positioning the mounting cylinder 24 on the upper part of the ball aligning mask 16 and adsorbing air from the suction portion 24B on the top of the mounting cylinder 24; the assembled solder balls 78s are moved on the ball aligning mask 16 by moving the mounting cylinder 24 in the horizontal direction, and the solder balls 78s can be dropped to the respective connecting pads 75 of the printed wiring board 10 through the respective openings 16a of the ball aligning mask 16.

Therefore, fine solder balls 78s can certainly be mounted on the whole of the connecting pads 75 of the printed wiring board 10. Further, since the solder balls 78s can be moved with no contact, the solder balls can be mounted on the connecting pads 75 without injury, which is different from a printing method with the use of a conventional squeeze, and the solder bumps 78U can be made having an equal height.

Therefore, according to the above-described method, there are provided excellent mountability of electronic parts such as ICs and the like, heat cycle test after the mounting and environment resistance test such as high temperature-high humidity test and the like.

Further, without depending on flatness of products, even printed wiring board having much undulated surface can place solder balls on the connecting pads.

Further, as the fine solder balls could certainly be placed on the connecting pads, even in the printed wiring board having such pitch alignment that the connecting pad pitch is about 60 to about 200 μm and the solder resist opening diameter is about 40 to about 150 μm, in the whole of bumps, stable bumps having substantially uniform heights ca be formed.

Further, the solder balls are guided by suction force so as to prevent aggregation and adhesion of solder balls. Further, works (multilayer printed wiring board of work sheet size) having various sizes can be used by adjusting number of the mounting cylinder 24 so as to be applied to many forms and small production.

In the solder ball loader as described above, the mounting cylinders 24 are aligned in the Y-axis direction by corresponding to width of the work (printed wiring board of work sheet size), so that the solder balls can positively be mounted-on the whole of connecting pads 75 of the printed wiring boards by simply sending a plurality of mounting cylinders 24 to the vertical direction (X direction) in relation to the row direction.

Further, the solder balls 78s remained on the ball aligning mask 16 can be collected by the solder ball removing cylinder 61, so that there are no problem such that excessive solder ball are remained to cause any trouble and the like.

With the use of the above-described solder ball loading method and device, the solder balls mounted on the connecting pads of the wiring substrate become solder bumps having predetermined height by means of a reflow treatment, IC chips are mounted on the substrate through such solder bumps, and the printed wiring board according to the present invention is manufactured.

Example 1

(1) Manufacture of Printed Wiring Board

As starting material, a double sided copper-clad laminate (e.g. "MCL-E-67" made by Hitachi Chemical) is used, and on this substrate are formed a through-hole conductor and a conductor circuit by a known method. Thereafter, insulating layers and conductor circuit layers are alternately laminated by a known method (e.g. described in a book entitled "Build-up multilayer printed wiring board" (Kiyoshi Takagi) published by Nikkan Kogyo Shinbunsha on Jun. 20, 2000, and the content of this book is incorporated herein by reference in its entirety.), and in the outermost conductor circuit layer, a group of connecting pads for mounting IC chips consisting a grid-like arrangement having thickness: 20 μm, diameter (conductor pad diameter): 120 μm, pitch: 150 μm, number: 50×40 (pieces) is formed within a connecting pad region of 150 mm².

Such connecting pad are formed by a method similar to that described in Japanese unexamined patent application No. 2000-357762. The disclosure of Japanese unexamined patent application No. 2000-357762 is incorporated herein by reference in its entirety.

Further, in case of changing size, pitch, number and arrangement of connecting pad, the pattern (opening diameter, pitch, arrangement, etc.) of a plated resist is changed.

Formation of a solder resist layer is that screen printing is carried out under the following printing condition with the use of a commercial solder resist to form a solder resist layer having a thickness of about 15 to about 25 μm (on the connecting pad) for covering the connecting pad.

(Printing Condition)
Solder resist ink: "RPZ-1" made by Hitachi Kogyo
Ink viscosity: 45±15 Pa·s
Screen print: polyester fiber (130 to 300 mesh)
Speed of squeeze: 100 to 200 mm/seconds In this embodiment, there is formed a solder resist layer having a thickness of 16 μm.

Thereafter, a photo mask depicted the pattern (mask pattern) of a solder resist opening is exposed to ultraviolet rays of about 100 to 1000 mJ under the state of adhering to the solder resist layer, development treatment is carried out with the use of a horizontal type developer under the following developing condition, thereby forming an opening of about 40 to 150 pin in diameter on the connecting pad.

(Horizontal Type Developer)

As the horizontal developing device, use is made of a horizontal developing device comprising a conveyor for bringing the substrate in a developing treatment zone and conveying the developing treatment zone and a plurality of spray nozzles positioned at top and bottom of the substrate for adjusting spray pressure.

(Development Condition)
(1) Kind of spray: slit nozzle (linearly spraying a solution) or full cone nozzle (radially spraying a solution) is used.
(2) Oscillation of spray: presence or absence
(3) Spray face used: Top or bottom face (in case of developing with a spray positioned at the top face of the substrate, the substrate is brought in the developing device by upwardly facing a solder resist face for forming an opening. In case of developing with a spray positioned at the lower part of the substrate, the substrate is brought in the developing device by downwardly facing the solder resist face for forming the opening.)
(4) Spray pressure: 0.05 to 0.3 MPa
(5) Developing solution: Sodium carbonate ($Na_2CO_3$) solution of 5 to 15 g/L
(6) Developing time: 10 to 300 seconds In this embodiment, an opening (diameter of an opening of the solder resist layer surface is equal to diameter of an opening of the connecting pad) of about 80 μm in diameter is formed by facing the solder resist face downwardly under the state of not oscillating the slit nozzle positioned at the lower part and by developing with the use of a sodium carbonate ($Na_2CO_3$) solution of 10 g/L in concentration.

(2) Loading of Solder Ball

To the surface (IC mounting face) of the printed wiring board manufactured in (1) is applied commercial rosin flux, then loaded on an adsorption table of a solder ball loading device, an alignment mark of the printed wiring board and the ball aligning mask is recognized by using a CCD camera, and alignment of the printed wiring board and the ball aligning mask is carried out.

Here, as the ball aligning mask, use is made of a metal mask made of Ni having an opening of about 100 μm in diameter at the position corresponding to the connecting pad of the printed wiring board. It is also possible to use ball aligning masks of SUS and polyimide.

Further, an opening diameter formed in the ball aligning mask is preferably about 1.1 to about 1.5 times the ball diameter used, and a thickness of the ball aligning mask is preferably about ½ to about ¾ of the diameter of the solder ball used.

Next, the mounting cylinder of about 200 mm in height with a size (about 1.2 to about 3 times to the connecting pad region) corresponding to the connecting pad region is positioned on the metal mask (ball aligning mask) by keeping clearance of about 2 times the solder ball diameter, and solder balls (made by Hitachi Metals) of about 85 μm in diameter consisting of Sn/Pb solder (Sn/Pb=63:37) are mounted on the peripheral vicinity of the mask.

In this example, Sn/Pb is used for the solder ball, use may be made of Pb free solder consisting of at least one metal and Sn selected from the group of Ag, Co, In, Bi, Zn and the like. And, air is adsorbed from the top of the mounting cylinder, and the air speed in a gap between the mounting cylinder and the printed wiring board is regulated to about 5 to about 35 m/sec for assembling the solder balls within the mounting cylinder.

Thereafter, the mounting cylinder is moved at about 10 to about 40 mm/sec to roll the solder balls, and the solder balls are dropped from the respective openings of the ball aligning mask and mounted on the corresponding connection pads.

(3) Formation of Solder Bump

Further, after removing excessive solder balls on the ball aligning mask, the solder ball aligning mask and the printed wiring board are separately taken out of the solder ball loader, and finally, the printed wiring board is put in the reflow furnace set at 230° C. to form a solder bump.

After forming the solder bump, a diameter of the solder bump protruded from the solder resist surface is measured by a laser microscope ("WYKO NT-2000" made by Veeco). As a result, the diameter is 84 μm.

(4) Mounting of IC Chip

After measuring the height of each solder bump, an IC chip is mounted through the solder bumps, and the IC chip mounted printed wiring board is manufactured by filling a commercial under fill resin between the IC chip and the solder resist.

Example 2

Except that the solder ball of 100 μm in diameter is loaded, the printed wiring board is manufactured in the same manner as in Example 1. As a result, the solder bump diameter becomes 100 μm.

Example 3

Except that the solder ball of 120 μm in diameter is loaded, the printed wiring board is manufactured in the same manner as in Example 1. As a result, the solder bump diameter becomes 120 μm.

Example 4

Except that the solder ball of 140 μm in diameter is loaded, the printed wiring board is manufactured in the same manner as in Example 1. As a result, the solder bump diameter becomes 135 μm.

Example 5

Except that the full cone nozzle is used without oscillation, the printed wiring board is manufactured in the same manner as in Example 1. As a result, there is formed a' trapezoidal opening such as 85μ of the top opening diameter and 80 μm of the bottom opening diameter, but the solder bump diameter becomes the same 84 μm as in Example 1.

This is because the portion protruded on the solder resist occupies most part as understood from FIG. 10B, so that it is assumed that volume of the solder bump is not influenced by the form of the solder resist opening.

Further, in this example, in comparison with the case that the solder resist layer opening as shown in FIG. 10A is a rectangle in section, the solder resist layer opening is made a trapezoid in section as shown in FIG. 10B, that is, it is understood that the form (circled with a dotted line) of the boundary portion of the solder bump and the solder resist layer surface is different by tapering.

Example 6

Except that the solder ball of 100 μm in diameter is used, the printed wiring board is manufactured in the same manner as in Example 5. As a result, the solder bump diameter becomes 105 μm.

Example 7

Except that the solder ball of 120 μm in diameter is used, the printed wiring board is manufactured in the same manner as in Example 5. As a result, the solder bump diameter becomes 128 μm.

Example 8

Except that the solder ball of 140 μm in diameter is used, the printed wiring board is manufactured in the same manner as in Example 5. As a result, the solder bump diameter becomes 145 μm.

Example 9

Except that the full cone nozzle is used under the oscillating condition and the solder ball having a 2 μm larger diameter is used, the printed wiring board is manufactured in the same manner as in Example 5. As a result, there is formed a trapezoidal opening which top opening diameter is 90 μm and bottom opening diameter is 80 μm, and the solder bump diameter becomes 94 μm.

Example 10

Except that the full cone nozzle is used under the oscillating condition and the solder ball having a 2 μm larger diameter is used, the printed wiring board is manufactured in the same manner as in Example 6. As a result, there is formed a trapezoidal opening which top opening diameter is 90 μm and bottom opening diameter is 80 μm, and the solder bump diameter becomes 113 μm.

Example 11

Except that the full cone nozzle is used under the oscillating condition and the solder ball having a 2 μm larger diameter is used, the printed wiring board is manufactured in the same manner as in Example 7. As a result, there is formed a trapezoidal opening which top opening diameter is 90 μm and bottom opening diameter is 80 μm, and the solder bump diameter becomes 135 μm.

Example 12

Except that the full cone nozzle is used under the oscillating condition and the solder ball having a 2 μm larger diameter is used, the printed wiring board is manufactured in the same manner as in Example 8. As a result, there is formed a trapezoidal opening which top opening diameter is 90 μm and bottom opening diameter is 80 μm, and the solder bump diameter becomes 155 μm.

Example 13

Except that the full cone nozzle positioned at the upper part is oscillated by facing the solder resist face upwardly and the solder ball having a 2 μm larger diameter is used, the printed wiring board is manufactured in the same manner as in Example 9. As a result, there is formed a trapezoidal opening which top opening diameter is 100 μm and bottom opening diameter is 80 μm, and the solder bump diameter becomes 105 μm.

Example 14

Except that the full cone nozzle positioned at the upper part is oscillated by facing the solder resist face upwardly and the solder ball having a 2μ larger diameter is used, the printed wiring board is manufactured in the same manner as in Example 10. As a result, there is formed a trapezoidal opening which top opening diameter is 100μ and bottom opening diameter is 80 μm, and the solder bump diameter becomes 125 μm.

Example 15

Except that the full cone nozzle positioned at the upper part is oscillated by facing the solder resist face upwardly and the solder ball having a 2 μm larger diameter is used, the printed wiring board is manufactured in the same manner as in Example 11. As a result, there is formed a trapezoidal opening which top opening diameter is 100 μm and bottom opening diameter is 80 μm, and the solder bump diameter becomes 150 μm.

Example 16

Except that the full cone nozzle positioned at the upper part is oscillated by facing the solder resist face upwardly and the solder ball having a 2 μm larger diameter is used, the printed wiring board is manufactured in the same manner as in Example 12. As a result, there is formed a trapezoidal opening which top opening diameter is 100 μm and bottom opening diameter is 80 μm, and the solder bump diameter becomes 170 μm.

Example 17

Except that the pattern of the plated resist for forming a connecting pad is changed so that the connecting pad of 70 μm in diameter is formed at 100 μm pitch, and the diameter of the mask for forming the opening of the solder resist layer is changed so that an opening (top opening diameter=bottom opening diameter) of 60 μm in opening diameter is formed, and the solder ball of 63 μm in diameter is used, the printed wiring board is manufactured in the same manner as in Example 1. As a result, the solder bump diameter becomes 63 μm.

Example 18

Except that the solder ball of 70 μm in diameter is used, the printed wiring board is manufactured in the same manner as in Example 17. As a result, the solder bump diameter becomes 75 μm.

Example 19

Except that the solder ball of 80 μm in diameter is used, the printed wiring board is manufactured in the same manner as in Example 17. As a result, the solder bump diameter becomes 90 μm.

Example 20

Except that the solder ball of 95 μm in diameter is used, the printed wiring board is manufactured in the same manner as in Example 17. As a result, the solder bump diameter becomes 102 μm.

Example 21

Except that the connecting pad of 70 μm in diameter is formed at 100 μm pitch in the same manner as in Example 17, and the diameter of the mask for forming the opening of the solder resist layer is changed so that an opening of 65 μm in top opening diameter and 60 μm in bottom opening diameter is formed, and the solder bump of 63 μm in diameter is used, the printed wiring board is manufactured in the same manner as in Example 5. As a result, the solder bump diameter becomes 68 μm.

Example 22

Except that the connecting pad of 70 μm in diameter is formed at 100 μm pitch in the same manner as in Example 17, and the diameter of the mask for forming the opening of the solder resist layer is changed so that an opening of 65 μm in top opening diameter and 60 tun in bottom opening diameter is formed, and the solder bump of 70 μm in diameter is used, the printed wiring board is manufactured in the same manner as in Example 5. As a result, the solder bump diameter becomes 80 μm.

Example 23

Except that the connecting pad of 70 μm in diameter is formed at 100 μm pitch in the same manner as in Example 17, and the diameter of the mask for forming the opening of the solder resist layer is changed so that an opening of 65 μm in top opening diameter and 60 μm in bottom opening diameter is formed, and the solder bump of 80 μm in diameter is used, the printed wiring board is manufactured in the same manner as in Example 5. As a result, the solder bump diameter becomes 96 μm.

Example 24

Except that the connecting pad of 70 μm in diameter is formed at 100 μm pitch in the same manner as in Example 17, and the diameter of the mask for forming the opening of the solder resist layer is changed so that an opening of 65 μm in top opening diameter and 60 μm in bottom opening diameter is formed, and the solder bump of 95 μm in diameter is used, the printed wiring board is manufactured in the same manner as in Example 5. As a result, the solder bump diameter becomes 110 μm.

Example 25

Except the use of a full cone nozzle under the oscillating state and the use of a solder ball of a 2 μm larger diameter, the printed wiring board is manufactured in the same manner as in Example 21. As a result, there is formed a trapezoidal opening of 70 μm in top opening diameter and 60 μm in bottom opening diameter, and the solder bump diameter becomes 73 μm.

Example 26

Except the use of a full cone nozzle under the oscillating state and the use of a solder ball of a 2 μm larger diameter, the printed wiring board is manufactured in the same manner as in Example 22. As a result, there is formed a trapezoidal opening of 70 μm in top opening diameter and 60 μm in bottom opening diameter, and the solder bump diameter becomes 88 μm.

Example 27

Except the use of a full cone nozzle under the oscillating state and the use of a solder ball of a 2 μm larger diameter, the printed wiring board is manufactured in the same manner as in Example 23. As a result, there is formed a trapezoidal opening of 70 μm in top opening diameter and 60 μm in bottom opening diameter, and the solder bump diameter becomes 105 μm.

Example 28

Except the use of a full cone nozzle under the oscillating state and the use of a solder ball of a 2 μm larger diameter, the printed wiring board is manufactured in the same manner as in Example 24. As a result, there is formed a trapezoidal opening of 70 μm in top opening diameter and 60 μm in bottom opening diameter, and the solder bump diameter becomes 120 μm.

Example 29

Except the use of a solder ball of a 2 μm larger in diameter by turning the solder resist face toward the upper part and oscillating the full cone nozzle positioned at the upper part, the printed wiring board is manufactured in the same manner as in Example 25. As a result, there is formed a trapezoidal opening of 80 μm in top opening diameter and 60 μm in bottom opening diameter, and the solder bump diameter becomes 84 μm.

Example 30

Except the use of a solder ball of a 2 μm larger in diameter by turning the solder resist face toward the upper part and oscillating the full cone nozzle positioned at the upper part, the printed wiring board is manufactured in the same manner as in Example 26. As a result, there is formed a trapezoidal opening of 80 μm in top opening diameter and 60 μm in bottom opening diameter, and the solder bump diameter becomes 100 μm.

Example 31

Except the use of a solder ball of a 2 μm larger in diameter by turning the solder resist face toward the upper part and oscillating the full cone nozzle positioned at the upper part, the printed wiring board is manufactured in the same manner as in Example 27. As a result, there is formed a trapezoidal opening of 80 μm in top opening diameter and 60 μm in bottom opening diameter, and the solder bump diameter becomes 120 μm.

Example 32

Except the use of a solder ball of a 2 μm larger in diameter by turning the solder resist face toward the upper part and oscillating the full cone nozzle positioned at the upper part, the printed wiring board is manufactured in the same manner as in Example 28. As a result, there is formed a trapezoidal opening of 80 μm in top opening diameter and 60 μm in bottom opening diameter, and the solder bump diameter becomes 135 μm.

Example 33

Except that the pattern of the plated resist for forming a connecting pad is changed so that the connecting pad of 150 μm in diameter is formed at 190 μm pitch, and the diameter of the mask for forming the opening of the solder resist layer is changed so that an opening (top opening diameter=bottom opening diameter) of 103 μm in opening diameter is formed, and the solder ball of 105 μm in diameter is used, the printed wiring board is manufactured in the same manner as in Example 1. As a result, the solder bump diameter becomes 108 μm.

Example 34

Except that the pattern of the plated resist for forming a connecting pad is changed so that the connecting pad of 70 μm in diameter is formed at 100 μm pitch, and the solder ball of 125 μm in diameter is used, the printed wiring board is manufactured in the same manner as in Example 33. As a result, the solder bump diameter becomes 130 μm.

Example 35

Except the use of a solder ball of 155 μm in diameter, the printed wiring board is manufactured in the same manner as in Example 33. As a result, the solder bump diameter becomes 155 μm.

Example 36

Except the use of a solder ball of 180 μm in diameter, the printed wiring board is manufactured in the same manner as in Example 33. As a result, the solder bump diameter becomes 175 μm.

Example 37

Except that the connecting pad of 150 μm in diameter is formed at 190 μm pitch in the same manner as in Example 33, and the diameter of the mask for forming the opening of the solder resist layer is changed so that an opening of 108 μm in top opening diameter and 103 μm in bottom opening diameter is formed, and the solder bump of 105 μm in diameter is used, the printed wiring board is manufactured in the same manner as in Example 33. As a result, the solder bump diameter becomes 113 μm.

Example 38

Except that the connecting pad of 150 μm in diameter is formed at 190 μm pitch in the same manner as in Example 33, and the diameter of the mask for forming the opening of the solder resist layer is changed so that an opening of 108 μm in top opening diameter and 103 μm in bottom opening diameter is formed, and the solder bump of 125 μm in diameter is used, the printed wiring board is manufactured in the same manner as in Example 33. As a result, the solder bump diameter becomes 135 μm.

Example 39

Except that the connecting pad of 150 μm in diameter is formed at 190 μm pitch in the same manner as in Example 33, and the diameter of the mask for forming the opening of the solder resist layer is changed so that an opening of 108 μm in top opening diameter and 103 μm in bottom opening diameter is formed, and the solder bump of 155 μm in diameter is used, the printed wiring board is manufactured in the same manner as in Example 33. As a result, the solder bump diameter becomes 162 μm.

Example 40

Except that the connecting pad of 150 μm in diameter is formed at 190 μm pitch in the same manner as in Example 33, and the diameter of the mask for forming the opening of the solder resist layer is changed so that an opening of 108 μm in top opening diameter and 103 μm in bottom opening diameter is formed, and the solder bump of 180 μm in diameter is used, the printed wiring board is manufactured in the same manner as in Example 33. As a result, the solder bump diameter becomes 185 μm.

Example 41

Except the formation of an opening of 113 in top opening diameter and 103 μm in bottom opening diameter by oscillating the full cone nozzle, and the use of a solder ball having a 2 μm larger diameter, the printed wiring board is manufactured in the same manner as in Example 37. As a result, the solder bump diameter becomes 118 μm.

Example 42

Except the formation of an opening of 113 μm in top opening diameter and 103 μm in bottom opening diameter by oscillating the full cone nozzle, and the use of a solder ball having a 2 μm larger diameter, the printed wiring board is manufactured in the same manner as in Example 38. As a result, the solder bump diameter becomes 140 μm.

Example 43

Except the formation of an opening of 113 μm in top opening diameter and 103 μm in bottom opening diameter by oscillating the full cone nozzle, and the use of a solder ball having a 2 μm larger diameter, the printed wiring board is manufactured in the same manner as in Example 39. As a result, the solder bump diameter becomes 170 μm.

Example 44

Except the formation of an opening of 113 μm in top opening diameter and 103 μm in bottom opening diameter by oscillating the full cone nozzle, and the use of a solder ball having a 2 μm larger diameter, the printed wiring board is manufactured in the same manner as in Example 40. As a result, the solder bump diameter becomes 192 μm.

Example 45

Except the turning of the solder resist face toward the upper part, oscillating the full cone nozzle positioned at the upper part, and the use of a sold ball having a 2 μm larger diameter, the printed wiring board is manufactured in the same manner as in Example 41. As a result, there is formed a trapezoidal opening of 123 μm in top opening diameter and 103 μm in bottom opening diameter, and the solder bump diameter becomes 129 μm.

Example 46

Except the turning of the solder resist face toward the upper part, oscillating the full cone nozzle positioned at the upper part, and the use of a sold ball having a 2 μm larger diameter, the printed wiring board is manufactured in the same manner as in Example 42. As a result, there is formed a trapezoidal opening of 123 μm in top opening diameter and 103 μm in bottom opening diameter, and the solder bump diameter becomes 153 μm.

Example 47

Except the turning of the solder resist face toward the upper part, oscillating the full cone nozzle positioned at the upper part, and the use of a sold ball having a 2 μm larger diameter, the printed wiring board is manufactured in the same manner as in Example 43. As a result, there is formed a trapezoidal opening of 123 μm in top opening diameter and 103 μm in bottom opening diameter, and the solder bump diameter becomes 185 μm.

Example 48

Except the turning of the solder resist face toward the upper part, oscillating the full cone nozzle positioned at the upper part, and the use of a sold ball having a 2 μm larger diameter, the printed wiring board is manufactured in the same manner as in Example 44. As a result, there is formed a trapezoidal opening of 123 μm in top opening diameter and 103 μm in bottom opening diameter, and the solder bump diameter becomes 210 μm.

Reference Example 1

Except the use of a solder ball of 160 μm in diameter, the printed wiring board is manufactured in the same manner as in Example 1. As a result, the solder bump diameter becomes 160 μm.

Reference Examples 2 to 49

Except that number of conductor pad is changed to 30,000 (connecting pad region 1,200 mm$^2$), the printed wiring board is manufactured in the same manner as in Examples 1 to 48.

Comparative Example

Except the use of a solder ball of 60 μm in diameter, the printed wiring board is manufactured in the same manner as in Example 1. As a result, solder could not completely be filled in the solder resist opening.

(Heat Cycle Test)

In the IC mounting printed boards manufacture according to Examples 1 to 48, Reference Example 1 and Comparative Example, electric resistance of the specific circuits through IC chips, that is, electric resistance between a pair of connecting pads exposed to the faces opposite to IC chip loading faces of the IC chip mounting printed wiring boards and conducted to the IC chips is measured and the values thereof are made as initial values. Thereafter, these IC mounting printed wiring boards are left in 85° C.×85% atmosphere for 24 hours, then a heat cycle test using −55° C.×30 min and 125° C.×30 min as one cycle and repeating the cycle 2500 times is carried out. Electric resistances after 500 cycles, 1000 cycles, 1250 cycles and 1500 cycles are measured, respectively, and rates of change with the initial values (100×(measured values−initial values)/initial values) (%) are obtained. The test results are shown in Tables 1 and 2.

Further, in case that the rate of change is within ±10, it is evaluated as "good" and shown with O, and the other cases are evaluated as "no good" and shown with x.

The evaluation results of Reference Examples 2 to 49 are not shown in Tables, but are the same as those of Examples 1 to 48 corresponding to each Reference Examples.

TABLE 1

| | Opening diameter (D) at the top face/bottom face of solder resist | Solder bamp diameter (W) | (W)/(D) | Heat cycle test(repetitions) | | | | |
|---|---|---|---|---|---|---|---|---|
| | | | | 500 | 750 | 1000 | 1250 | 1500 |
| Example 1 | 80/80 | 84 | 1.05 | O | O | X | X | X |
| Example 2 | 80/80 | 100 | 1.25 | O | O | X | X | X |
| Example 3 | 80/80 | 120 | 1.50 | O | O | X | X | X |
| Example 4 | 80/80 | 135 | 1.69 | O | O | X | X | X |
| Example 5 | 85/80 | 89 | 1.05 | O | O | O | O | O |
| Example 6 | 85/80 | 105 | 1.24 | O | O | O | O | O |
| Example 7 | 85/80 | 128 | 1.51 | O | O | O | O | X |
| Example 8 | 85/80 | 145 | 1.71 | O | O | O | X | X |
| Example 9 | 90/80 | 94 | 1.04 | O | O | O | O | O |
| Example 10 | 90/80 | 113 | 1.26 | O | O | O | O | O |
| Example 11 | 90/80 | 135 | 1.50 | O | O | O | O | X |
| Example 12 | 90/80 | 155 | 1.72 | O | O | O | X | X |
| Example 13 | 100/80 | 105 | 1.05 | O | O | O | O | O |
| Example 14 | 100/80 | 125 | 1.25 | O | O | O | O | O |
| Example 15 | 100/80 | 150 | 1.50 | O | O | O | O | X |
| Example 16 | 100/80 | 170 | 1.70 | O | O | O | X | X |
| Example 17 | 60/60 | 63 | 1.05 | O | O | X | X | X |
| Example 18 | 60/60 | 75 | 1.25 | O | O | X | X | X |
| Example 19 | 60/60 | 90 | 1.50 | O | O | X | X | X |
| Example 20 | 60/60 | 102 | 1.70 | O | O | X | X | X |
| Example 21 | 65/60 | 68 | 1.05 | O | O | O | O | O |
| Example 22 | 65/60 | 80 | 1.23 | O | O | O | O | O |
| Example 23 | 65/60 | 96 | 1.48 | O | O | O | O | X |
| Example 24 | 65/60 | 110 | 1.69 | O | O | O | X | X |

TABLE 2

| | Opening diameter (D) at the top/bottom face of solder resist | Solder bamp diameter (W) (μm) | (W)/(D) | Heat cycle test (repetitions) | | | | |
|---|---|---|---|---|---|---|---|---|
| | | | | 500 | 750 | 1000 | 1250 | 1500 |
| Example 25 | 70/60 | 73 | 1.04 | O | O | O | O | O |
| Example 26 | 70/60 | 88 | 1.26 | O | O | O | O | O |
| Example 27 | 70/60 | 105 | 1.50 | O | O | O | O | X |
| Example 28 | 70/60 | 120 | 1.71 | O | O | O | X | X |
| Example 29 | 80/60 | 84 | 1.05 | O | O | O | O | O |
| Example 30 | 80/60 | 100 | 1.25 | O | O | O | O | O |
| Example 31 | 80/60 | 120 | 1.50 | O | O | O | O | X |
| Example 32 | 80/60 | 135 | 1.69 | O | O | O | X | X |
| Example 33 | 103/103 | 108 | 1.05 | O | O | X | X | X |
| Example 34 | 103/103 | 130 | 1.26 | O | O | X | X | X |
| Example 35 | 103/103 | 155 | 1.50 | O | O | X | X | X |
| Example 36 | 103/103 | 175 | 1.70 | O | O | X | X | X |
| Example 37 | 108/103 | 113 | 1.05 | O | O | O | O | O |
| Example 38 | 108/103 | 135 | 1.25 | O | O | O | O | O |
| Example 39 | 108/103 | 162 | 1.50 | O | O | O | O | X |
| Example 40 | 108/103 | 185 | 1.71 | O | O | O | X | X |
| Example 41 | 113/103 | 118 | 1.04 | O | O | O | O | O |
| Example 42 | 113/103 | 140 | 1.24 | O | O | O | O | O |
| Example 43 | 113/103 | 170 | 1.50 | O | O | O | O | X |
| Example 44 | 113/103 | 192 | 1.70 | O | O | O | X | X |
| Example 45 | 123/103 | 129 | 1.05 | O | O | O | O | O |

TABLE 2-continued

| | Opening diameter (D) at the top/bottom face of solder resist | Solder bamp diameter (W) (μm) | (W)/(D) | Heat cycle test (repetitions) | | | | |
|---|---|---|---|---|---|---|---|---|
| | | | | 500 | 750 | 1000 | 1250 | 1500 |
| Example 46 | 123/103 | 153 | 1.24 | ○ | ○ | ○ | ○ | ○ |
| Example 47 | 123/103 | 185 | 1.50 | ○ | ○ | ○ | ○ | X |
| Example 48 | 123/103 | 210 | 1.71 | ○ | ○ | ○ | X | X |
| Reference Example 1 | 80/80 | 160 | 2.00 | ○ | X | X | X | X |
| Comparative Example | 80/80 | — | <1.0 | X | X | X | X | X |

From such test results, Examples 1 to 48 and Reference Example 1 completely filling the solder bump in the opening of the solder resist are liable to improve connection reliability as compared with Comparative Example. This is because volume of the solder bump is large and stress owing to thermal expansion difference between IC chips and printed wiring boards is more mitigated, or because of no gap between solder resists and solder bumps, voids are difficult to generate within under fill, or no residuum of flux and clearing solution.

Further, connection reliability is liable to improve in order of (1) when the ratio (W/D) of a solder bump diameter W to a solder resist opening diameter D is within a range of about 1.05 to 1.7, (2) when the solder resist opening is a tapered form wherein the top opening diameter is larger than the bottom opening diameter, and the ratio (W/D) is within a range of about 1.05 to 1.5, and (3) when the solder resist opening is a tapered form wherein the top opening diameter is larger than the bottom opening diameter, and the ratio (W/D) is within a range of about 1.05 to 1.25.

It is considered that if the ratio (W/D) exceeds about 1, the solder bump tends to bend at the boundary with the solder resist layer surface (the portion of solder bump exposed from the surface of solder resist layer to the outside, which is circled with a dotted line in FIG. 10A), and stress tends to concentrate in this bent portion, so that connection reliability is improved when a bending degree is made small. The bending degree is correlated to the ratio (W/D), and it is assumed that connection reliability is easily improved when the ratio (W/D) is about 1.7 or less.

In the solder bump completely filled in the solder resist layer opening as described above, solder volume is large, so that significance of applying to the printed wiring board having a large connecting pad region such as about 2000 to 30000 solder bumps is large. When the connecting pad region (rectangular region including outermost connecting pad) is large, shearing stress due to thermal expansion coefficient difference between IC chips and printed wiring boards becomes large.

Examples 49 to 66

Next, in the Examples 5, 6, 9, 10, 13, 14, 21, 22, 25, 26, 29, 30, 37, 38, 41, 42, 45 and 46, except that flattening treatment for minimizing unevenness of the solder resist layer surface due to presence of the connecting pad by heat pressing the solder resist layer surface under the following condition after forming the solder resist layer, the IC mounting printed wiring board is manufactured in the same manner as in each example, and described as Examples 49 to 66.
(Press Condition)
Press temperature: 80° C.
Press pressure: 5 MPa
Press time: 2 minutes Here, before and after the flattening treatment, an uneven amount of the solder resist surface is measured at the same spot by means of a surface roughness measuring instrument (e.g. "SURFCOM 480A" made by Tokyo Seimitsu or "WYKO N-2500" by Veeco).

Figure 8:
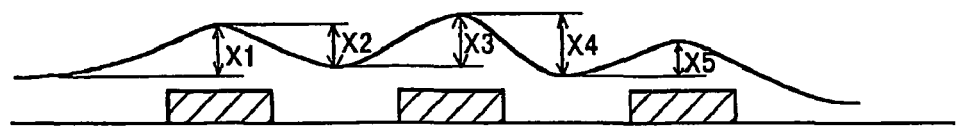
FIG. 8 is a schematic view explaining maximum roughness of the solder resist layer surface.

The measured spots (measured numbers are 5) are the solder resist layer surface positioned at the upper part of the connecting pad and the solder resist layer surface of the adjacent connecting pad non-forming portion (see FIG. 8). That is, the uneven amount of the solder resist layer surface due to presence of the connecting pad is measured, and the maximum value (max) and the minimum value (min) of the 5-point measured results are described. These measurement results are shown in Table 3 (before flattening treatment) and Table 4 (after flattening treatment).

Examples 67 to 84

Further, except that roughening treatment is applied to the solder resist layer surface under the following condition and uniformly fine unevenness is formed on the surface after flattening in Examples 49 to 66, the IC mounting printed wiring board is manufactured in the same manner as in each example, and described here as Examples 67 to 84.
(Roughening Condition)
Roughening solution: potassium permanganate ($KMnO_4$) solution
Concentration: 60 g/l
Temperature: 60° C.
Immersion time: 60 seconds Further, after the roughening treatment, surface roughness of the solder resist surface is measured at 10 spots at random with reference length 5 μm by means of a surface roughness measuring instrument (e.g. "SURFCOM 480A" made by Tokyo Seimitsu or "WYKO N-2500" by Veeco). As a result, surface roughness of the roughening treated solder resist layer becomes a small uneven face of about 0.1 μm to 0.6 μm at Ra.

Now, "surface roughness Ra" mentioned here means "arithmetic mean roughness Ra" prescribed by JIS B0601. The reason why Ra has a range in the above measured result is because that among respective Ra at the measured 10 spots, there are described the most minimum Ra as Ra (min) and the most maximum Ra as Ra (max).

Further, at each measurement point of 10 spots, when a distance between the highest top and the lowest bottom measured from the mean line to the uneven direction based on 5 μm of reference length is made Δ, a mean value of 10 Δ is described as Rmax.

However, surface roughening measurement is carried out at random 10 spots in the solder resist layer surface corresponding to the conductor circuit (pad) forming region and the conductor circuit non-forming region, but not in the boundary vicinity of the conductor circuit forming region and the conductor circuit non-forming region.

(Heat Cycle Test)

A heat cycle test is carried out for the IC mounting printed wiring board manufactured according to Examples 5, 6, 9, 10, 13, 14, 21, 22, 25, 26, 29, 30, 37, 38, 41, 42, 45 and 46, Examples 49 to 66, and Examples 67 to 84 by repeating 2500 times of 1 cycle of −55° C.×30 min and 125° C.×30 min after leaving in an atmosphere such as temperature of 85° C. and humidity of 85% for 24 hours. Electric resistances after 1750 cycles and 2000 cycles are measured, and the rate (100× (measured value−initial value)/initial value) (%) of change with the initial value is sought. The case of the rate of change within ±10 is evaluated as "good" and shown by O, and other cases are evaluated as "no good" and shown by x.

These test results are shown in Tables 3 to 5, respectively.

TABLE 3

| | Unevenness of solder resist layer surface (μm) | | Heat cycle test (repetitions) | |
|---|---|---|---|---|
| | Minimum amount of unevenness (min) | Maximum amount of unevenness (max) | 1750 | 2000 |
| Example 13 | 5 | 6.5 | X | X |
| Example 14 | 5.3 | 6 | X | X |
| Example 17 | 5.8 | 6.5 | X | X |
| Example 18 | 5.3 | 6 | X | X |
| Example 21 | 4.8 | 6.1 | X | X |
| Example 22 | 5.2 | 6 | X | X |
| Example 25 | 5.5 | 6.3 | X | X |
| Example 26 | 5.4 | 6.1 | X | X |
| Example 29 | 5.5 | 6.1 | X | X |
| Example 30 | 5.8 | 6.2 | X | X |
| Example 33 | 5.1 | 6 | X | X |
| Example 34 | 5 | 6.2 | X | X |
| Example 37 | 5.2 | 6.3 | X | X |
| Example 38 | 5.2 | 6.4 | X | X |
| Example 41 | 5.8 | 6.1 | X | X |

TABLE 3-continued

| | Unevenness of solder resist layer surface (μm) | | Heat cycle test (repetitions) | |
|---|---|---|---|---|
| | Minimum amount of unevenness (min) | Maximum amount of unevenness (max) | 1750 | 2000 |
| Example 42 | 5.4 | 6.5 | X | X |
| Example 45 | 5.5 | 6.1 | X | X |
| Example 46 | 5.4 | 6.1 | X | X |

TABLE 4

| | Unevenness of flattened surface of solder resist layer (μm) | | Heat cycle test (repetitions) | |
|---|---|---|---|---|
| | Minimum amount of unevenness (min) | Maximum amount of unevenness (max) | 1750 | 2000 |
| Example 49 | 0.8 | 3.0 | O | X |
| Example 50 | 0.8 | 3.2 | O | X |
| Example 51 | 0.7 | 3.1 | O | X |
| Example 52 | 0.7 | 3.0 | O | X |
| Example 53 | 0.7 | 3.0 | O | X |
| Example 54 | 0.8 | 3.2 | O | X |
| Example 55 | 0.8 | 3.1 | O | X |
| Example 56 | 0.7 | 3.0 | O | X |
| Example 57 | 0.8 | 3.0 | O | X |
| Example 58 | 0.7 | 3.0 | O | X |
| Example 59 | 0.8 | 3.2 | O | X |
| Example 60 | 0.8 | 3.1 | O | X |
| Example 61 | 0.8 | 3.0 | O | X |
| Example 62 | 0.8 | 3.2 | O | X |
| Example 63 | 0.7 | 3.1 | O | X |
| Example 64 | 0.8 | 3.0 | O | X |
| Example 65 | 0.7 | 3.0 | O | X |
| Example 66 | 0.8 | 3.2 | O | X |

TABLE 5

| | Unevenness of flattened surface of solder resist layer (pm) | | Roughness of roughened surface of solder resist layer(pm) | | | Heat cycle test (repetitions) | |
|---|---|---|---|---|---|---|---|
| | Minimum amount of unevenness (min) | Maximum amount of unevenness (max) | Ra min | Ra max | Maximum roughness (max) | 1750 | 2000 |
| Example 67 | 0.8 | 3.1 | 0.2 | 0.5 | 0.7 | O | O |
| Example 68 | 0.7 | 3.1 | 0.2 | 0.5 | 0.6 | O | O |
| Example 69 | 0.8 | 3.0 | 0.2 | 0.6 | 0.7 | O | O |
| Example 70 | 0.7 | 3.0 | 0.1 | 0.5 | 0.6 | O | O |
| Example 71 | 0.8 | 3.2 | 0.2 | 0.5 | 0.7 | O | O |
| Example 72 | 0.8 | 3.2 | 0.2 | 0.5 | 0.7 | O | O |
| Example 73 | 0.7 | 3.0 | 0.1 | 0.5 | 0.6 | O | O |
| Example 74 | 0.7 | 3.0 | 0.1 | 0.5 | 0.6 | O | O |
| Example 75 | 0.8 | 3.2 | 0.2 | 0.5 | 0.7 | O | O |
| Example 76 | 0.8 | 3.1 | 0.2 | 0.5 | 0.7 | O | O |
| Example 77 | 0.8 | 3.0 | 0.2 | 0.6 | 0.7 | O | O |
| Example 78 | 0.8 | 3.2 | 0.2 | 0.6 | 0.7 | O | O |
| Example 79 | 0.7 | 3.1 | 0.1 | 0.5 | 0.6 | O | O |
| Example 80 | 0.8 | 3.0 | 0.1 | 0.5 | 0.6 | O | O |
| Example 81 | 0.7 | 3.0 | 0.2 | 0.5 | 0.7 | O | O |
| Example 82 | 0.8 | 3.2 | 0.1 | 0.5 | 0.6 | O | O |
| Example 83 | 0.8 | 3.2 | 0.1 | 0.5 | 0.6 | O | O |
| Example 84 | 0.7 | 3.0 | 0.1 | 0.5 | 0.6 | O | O |

It is understood from the results of this evaluation test that connection reliability is easily improved when the uneven amount of the solder resist layer surface is preferably about 0.8 µm to 3.0 µm and further, the arithmetic mean roughness Ra thereof is about 0.2 µl to 0.5 µl.

The solder bump in the invention is large in bump diameter so as to increase bump height for its degree. Therefore, as the space between the solder resist layer surface and the IC chip becomes large, under fill is difficult to be filled and void tends to generate in the under fill. Here, as the moving speed of the under fill is liable to depend on the space between the solder resist layer surface and the IC chip, it is considered that unevenness of the solder resist layer surface is about 2 µm or less. On the other hand, if uneven amount and surface roughness (Ra) of the solder resist layer surface are small, adhesion of the solder resist to the under fill becomes weakened, so that it is assumed that the uneven amount of about 0.8 µm or more and further the surface roughness of about 0.2 µm to 0.5 µm are required. Further, the surface roughness of about 0.2 µm to 0.5 µm improves wettability of the under fill, so that it is considered that even in the bent solder bump is completely filled the under fill.

(Insulation Reliability Test)

The IC mounting printed wiring board manufactured according to Examples 1 to 84 and Comparative Example are left in an atmosphere of 85° C. in temperature and 85% in humidity for 100 hours by applying voltage of 3.3V between dependent solder bumps (electrically not connected solder bumps). After leaving as they are, insulation resistance between voltage-applied solder bumps is measured. The value of more than or equal to $10^7\Omega$ is evaluated as good and the value of less than $10^7\Omega$ is evaluated as no good. As a result, Examples 1 to 8 are recognized as good, while Comparative Example is as no good.

INDUSTRIAL APPLICABILITY

As explained above. the invention proposes a printed wiring board having excellent insulation reliability and insulation reliability by making the ratio (W/D) of a solder bump diameter W to an opening diameter D provided in the opening of a solder resist layer about 1.05 to about 1.7 even with such narrow pitch structure that a pitch of the solder bump is about 200 µm or less.

What is claimed is:

1. A printed wiring board comprising:
a wiring substrate;
a build-up wiring layer formed by laminating conductor circuits and at least one interlaminar resin insulating layer alternately on the wiring substrate, the conductor circuits situated in mutually different layers being connected electrically through at least one via hole;
a solder resist layer provided on the outermost interlaminar resin insulating layer and the outermost conductor circuit and having a plurality of openings, the plurality of openings exposing a plurality of parts of the conductor circuit forming a plurality of conductor pads for mounting electronic parts, respectively; and
a plurality of solder bumps formed on the plurality of conductor pads, respectively, wherein:
the conductor pads are aligned at a pitch of about 200 µm or less, and a ratio W/D of a diameter W of the solder bumps to an opening diameter D of the openings formed in the solder resist layer is about 1.05 to about 1.26, and
the openings of the solder resist layer are formed in a tapered fashion such that an opening diameter D1 at the top surface thereof is larger than an opening diameter D2 at the bottom surface thereof,
wherein the surface of the solder resist layer is subjected to a flattening treatment in at least an electronic parts mounting region, and
the flattened surface of the solder resist layer is further subjected to a roughening treatment,
wherein the flattened surface of the solder resist layer is about 0.8 µm to about 3.0 µm in maximum surface roughness,
and roughness of the roughened surface of the solder resist layer is smaller than the maximum surface roughness of the flattened surface, and about 0.2 µm to about 0.5 µm at an arithmetic mean roughness.

2. A printed wiring board comprising:
a wiring substrate;
a build-up wiring layer formed by laminating conductor circuits and at least one interlaminar resin insulating layer alternately on the wiring substrate, the conductor circuits situated in mutually different layers being connected electrically through at least one via hole;
a solder resist layer provided on the outermost interlaminar resin insulating layer and the outermost conductor circuit and having a plurality of openings, the plurality of openings exposing a plurality of parts of the conductor circuit forming a plurality of conductor pads for mounting electronic parts, respectively;
a plurality of solder bumps formed on the plurality of conductor pads, respectively;
at least one electronic part mounted on the conductor pads through the solder bumps; and
an under fill resin sealing between the electronic part and the solder resist layer,
wherein the conductor pads are aligned at a pitch of about 200 µm or less, and a ratio W/D of a diameter W of the solder bumps to an opening diameter D of the openings formed in the solder resist layer is about 1.05 to about 1.26, and
the openings of the solder resist layer are formed in a tapered fashion such that an opening diameter D1 at the top surface thereof is larger than an opening diameter D2 at the bottom surface thereof,
wherein the surface of the solder resist layer is subjected to a flattening treatment in at least an electronic parts mounting region, and
the flattened surface of the solder resist layer is further subjected to a roughening treatment.
wherein the flattened surface of the solder resist layer is about 0.8 µm to about 3.0 µm in maximum surface roughness, and
roughness of the roughened surface of the solder resist layer is smaller than the maximum surface roughness of the flattened surface, and about 0.2 µm to about 0.5 µm at an arithmetic mean roughness.

3. The printed wiring board of claim 1 or 2, wherein the plurality of conductor pads are formed in a plurality of filled vias, respectively, which are filled with a plated conductor within a plurality of openings provided in an interlayer resin insulating layer positioned at an outermost layer, and an uneven amount of the filled via surface exposed from the interlayer resin insulating layer is about −5 µm to about +5 µm in relation to the thickness of the conductor layer formed on the interlayer resin insulating layer.

4. The printed wiring board of claim 1, wherein the solder bumps are in contact with wall surfaces of the openings in the solder resist layer, respectively.

5. The printed wiring board of claim 1, wherein the solder bumps are formed by loading solder bumps on the conductor pads, respectively.

6. The printed wiring board of claim 1, wherein the conductor pads are position to align with respective contacts of the electric parts to be mounted on the printed wiring board.

7. The printed wiring board of claim 1 or 2, wherein the difference between the opening diameters D1-D2 is about 5 μm to about 20 μm.

8. The printed wiring board of claim 2, wherein the solder bumps are in contact with wall surfaces of the openings in the solder resist layer, respectively.

9. The printed wiring board of claim 2, wherein the solder bumps are formed by loading solder bumps on the conductor pads, respectively.

10. The printed wiring board of claim 2, wherein the conductor pads are position to align with respective contacts of the electric parts to be mounted on the printed wiring board.

* * * * *